(12) United States Patent
Aizenberg et al.

(10) Patent No.: US 9,229,218 B2
(45) Date of Patent: Jan. 5, 2016

(54) ENVIRONMENTALLY RESPONSIVE OPTICAL MICROSTRUCTURED HYBRID ACTUATOR ASSEMBLIES AND APPLICATIONS THEREOF

(75) Inventors: Joanna Aizenberg, Boston, MA (US); Michael Aizenberg, Boston, MA (US); Philseok Kim, Arlington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 71 days.

(21) Appl. No.: 13/990,385

(22) PCT Filed: Nov. 29, 2011

(86) PCT No.: PCT/US2011/062437
§ 371 (c)(1),
(2), (4) Date: Oct. 2, 2013

(87) PCT Pub. No.: WO2012/075033
PCT Pub. Date: Jun. 7, 2012

(65) Prior Publication Data
US 2014/0016177 A1    Jan. 16, 2014

Related U.S. Application Data

(60) Provisional application No. 61/417,665, filed on Nov. 29, 2010.

(51) Int. Cl.
*G02B 26/00* (2006.01)
*G02B 26/08* (2006.01)
*B29D 11/00* (2006.01)

(52) U.S. Cl.
CPC ............ *G02B 26/00* (2013.01); *B29D 11/0074* (2013.01); *G02B 26/0866* (2013.01); *Y10T 156/109* (2015.01)

(58) Field of Classification Search
CPC ............... G02B 26/00; G02B 26/0866; B29D 11/0074; Y10T 156/109
See application file for complete search history.

(56) References Cited

U.S. PATENT DOCUMENTS

| 2007/0237937 A1 | 10/2007 | Aizenberg et al. |
| 2008/0291424 A1 | 11/2008 | Lei |
| 2015/0093823 A1* | 4/2015 | Sutton et al. ................. 435/375 |

FOREIGN PATENT DOCUMENTS

WO    WO-2009158631    12/2009

OTHER PUBLICATIONS

International Search Report and Written Opinion for International Application No. PCT/US2011/062437 mailed Sep. 12, 2012. 13 pages.

\* cited by examiner

*Primary Examiner* — David N Spector
(74) *Attorney, Agent, or Firm* — Wilmer Cutler Pickering Hale and Dorr LLP

(57) ABSTRACT

Microstructured hybrid actuator assemblies in which microactuators carrying designed surface properties to be revealed upon actuation are embedded in a layer of responsive materials. The microactuators in a microactuator array reversibly change their configuration in response to a change in the environment without requiring an external power source to switch their optical properties.

11 Claims, 27 Drawing Sheets

Attached structures partially embedded in a uniform hydrogel film

Attached structures fully embedded in a uniform hydrogel film

Unattached structures embedded fully or partially in a uniform hydrogel film

Non-uniform hydrogel film covering the structures from one side to induce directional bending

A

B

A

B

ENVIRONMENTALLY RESPONSIVE OPTICAL MICROSTRUCTURED HYBRID ACTUATOR ASSEMBLIES AND APPLICATIONS THEREOF

RELATED APPLICATION

This application claims benefit of priority to U.S. Provisional Patent Application No. 61/417,665, filed Nov. 29, 2010, the entire disclosure of which is hereby incorporated by reference.

GOVERNMENT RIGHTS

This work was supported by the U.S. Air Force Office of Scientific Research (Award No. FA9550-09-1-0669-DOD35CAP), and the U.S. Department of Energy (Award No. DE-SC0005247). The United States Government may have certain rights to the invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

There is a need in the art for materials that can change their optical properties reversibly in response to the change in the environment, especially without requiring an external power source. Such change in the environment can be, for example, moisture change, temperature change, magnetic field change, electrical field change, pH change, illumination change, light intensity change, ion concentration change, and combinations thereof.

SUMMARY OF THE INVENTION

The invention is based, in part, on the discovery that optical properties of reconfigurable microactuator assemblies embedded in a layer of responsive materials can be used to reversibly change the optical properties of a material in response to environmental changes without requiring external power.

It is understood that any of the embodiments described below can be combined in any desired way, and any embodiment or combination of embodiments can be applied to each of the aspects described below.

In one aspect, the invention provides an apparatus comprising: a substrate with a surface; an environmentally responsive hydrogel polymer layer disposed on a region of the surface; and a plurality of microactuators embedded in the environmentally responsive hydrogel polymer layer; wherein the microactuators are configured to move from a first position to a second position in response to a volume change of the environmentally responsive hydrogel polymer layer from a first volume to a second volume and wherein the movement of microactuators alters optical properties of the apparatus.

In some embodiments, the microactuators are configured to reversibly move from a first position to a second position.

In some embodiments, the microactuators are configured to move from a first position to a second position gradually and in response to a volume change of the environmentally responsive hydrogel polymer layer.

In some embodiments, the microactuators are configured to move from a first position to a second position abruptly and in response to a volume change of the environmentally responsive hydrogel polymer layer.

In some embodiments, the environmentally responsive hydrogel polymer layer changes from a first volume to a second volume gradually.

In some embodiments, the environmentally responsive hydrogel polymer layer changes from a first volume to a second volume abruptly.

In some embodiments, the microactuators are configured to tilt with respect to a normal of the surface in response to the change in volume.

In some embodiments, the microactuators are configured to deform in response to the change in volume. In some embodiments, the microactuators are configured to bend in response to the change in volume. In some embodiments, the microactuators are configured to twist or buckle in response to the change in volume.

In some embodiments, the plurality of microactuators are cylindrical objects with a cross-section of arbitrary closed shape embedded fully or partially in the hydrogel layer.

In some embodiments, the plurality of microactuators are an array of posts, blades, cones, pyramids or inverted cones embedded fully or partially in the hydrogel layer. In some embodiments, the microactuators are cylindrical objects with a cross-section of arbitrary closed shape and with undulated sidewalls embedded fully or partially in the hydrogel layer.

In some embodiments, the plurality of microactuators are a plurality of plates embedded fully or partially in the hydrogel layer. In some embodiments, the plates are oval, elliptical, deformed, or C-type plates.

In some embodiments, the first end of each microactuator is in direct contact with the surface. In some embodiments, the first end of one or more microactuators is spaced apart from the surface. In some embodiments, the first end of one or more microactuators is attached to the surface.

In some embodiments, the microactuators are configured to substantially return to the first position as the environmentally responsive hydrogel polymer layer returns toward the first volume.

In some embodiments, the substrate has surface topography therein configured to cause the plurality of microactuators to move in a predetermined direction.

In some embodiments, the volume of the environmentally responsive hydrogel polymer layer is controlled by a stimulus or by a combination of stimuli selected from the group consisting of moisture change, temperature change, pressure change, magnetic field change, electrical field change, pH change, light intensity change, chemical species concentration change and ion concentration change.

In some embodiments, different portions of the environmentally responsive hydrogel polymer layer are responsive to different stimuli or to a different combination of stimuli. In some embodiments, the plurality of microactuators are embedded in the polymer in a staggered arrangement. In some embodiments, the plurality of microactuators are embedded in the polymer in a plurality of microarray patterns.

In some embodiments, the plurality of microactuators display a pattern upon actuation.

In some embodiments, the plurality of microactuators comprise a coating that affects their optical properties. In some embodiments, the plurality of microactuators comprise a diffraction grating that affects their optical properties. In some embodiments, the plurality of microactuators comprise a photonic crystal, a plasmonic material, a multilayer reflector, a luminescent material, or a diffraction grating that affects their optical properties. In some embodiments, the microactuators comprise a rare earth element or compound, plasmonic material, a fluorescent dye, a pigment or a bioluminescent material that affects their optical properties.

In some embodiments, the microactuators comprise an environmentally responsive material layer with an attached second layer or a surface coating. In some embodiments, the environmentally responsive material is a hydrogel.

In some embodiments, the apparatus further comprises an additional substrate with a surface.

In some embodiments, at least a portion of the substrate is transparent.

In some embodiments, sections of the microactuator array have different orientations of microactuators. In some embodiments, sections of the environmentally responsive hydrogel polymer layer respond differently to the environment.

In some embodiments, the environmentally responsive hydrogel polymer responds to a change in temperature. In some embodiments, the environmentally responsive hydrogel polymer responds to a change in light. In some embodiments, the environmentally responsive hydrogel polymer is photothermally actuated.

In some embodiments, the plurality of microactuators are an array of scalloped plates embedded fully or partially in the hydrogel layer.

In another aspect, the invention provides a method comprising: (a) providing the apparatus described above; and (b) exposing the environmentally responsive hydrogel polymer layer to a stimulus, the stimulus changing a volume of the environmentally responsive hydrogel polymer layer from a first volume to a second volume and thereby moving the microactuators from a first position to a second position.

In some embodiments, exposing the environmentally responsive hydrogel polymer layer to a stimulus tilts the microactuators with respect to a normal of the surface.

In some embodiments, the method further comprises causing the volume of the environmentally responsive hydrogel polymer layer to return to the first volume, thereby substantially returning the microactuators to the first position.

In some embodiments, exposing the polymer layer to a stimulus includes exposing the environmentally responsive hydrogel polymer layer to a stimulus or by a combination of stimuli selected from the group consisting of moisture change, temperature change, magnetic field change, electrical field change, light intensity change, pH change and ion concentration change.

In another aspect, the invention provides a method for manufacturing an apparatus, the method comprising: (a) providing a substrate with a surface; (b) embedding a plurality of microactuators in an environmentally responsive hydrogel polymer layer disposed on a region of the surface, wherein the microactuators are configured to move from a first position to a second position in response to a change in volume of the environmentally responsive hydrogel polymer layer from a first volume to a second volume and wherein the movement of microactuators alters optical properties of the apparatus. In some embodiments, the apparatus is the apparatus described above.

In another aspect, the invention provides an apparatus comprising: two substrates; an environmentally responsive hydrogel polymer layer disposed on a region between the two substrates; and a plurality of microactuators embedded in the environmentally responsive hydrogel polymer layer; wherein the microactuators are configured to move from a first position to a second position in response to a volume change of the environmentally responsive hydrogel polymer layer from a first volume to a second volume and wherein the movement of microactuators alters optical properties of the apparatus.

In some embodiments, the two substrates comprise glass or a transparent polymer.

In some embodiments, the volume of the environmentally responsive hydrogel polymer layer is controlled by a stimulus or by a combination of stimuli selected from the group consisting of temperature change and light intensity change.

In some embodiments, the apparatus is a window, a roof element, a shingle, or a louver.

In some embodiments, the apparatus is a sensor, packaging material, art protecting material, a road sign, a road stud or is comprised in intelligent cosmetics or jewelry.

In another aspect, the invention provides an apparatus comprising: a substrate with a surface; and a plurality of microactuators comprising an environmentally responsive hydrogel polymer layer disposed on a region of the surface; wherein the microactuators are configured to move from a first position to a second position in response to a volume change of the environmentally responsive hydrogel polymer layer from a first volume to a second volume and wherein the movement of microactuators alters optical properties of the apparatus.

In some embodiments, the microactuators are configured to reversibly move from a first position to a second position.

In some embodiments, the plurality of microactuators are cylindrical objects with a cross-section of arbitrary closed shape.

In some embodiments, the plurality of microactuators are an array of posts, blades, cones, pyramids or inverted cones.

In some embodiments, the microactuators are cylindrical objects with a cross-section of arbitrary closed shape and with undulated sidewalls.

In some embodiments, the plurality of microactuators are a plurality of plates. In some embodiments, the plates are oval, elliptical, deformed, or C-type plates.

In some embodiments, the microactuators are configured to tilt with respect to a normal of the surface in response to the change in volume.

In some embodiments, the microactuators are configured to deform in response to the change in volume. In some embodiments, the microactuators are configured to bend in response to the change in volume. In some embodiments, the microactuators are configured to twist or buckle in response to the change in volume.

In some embodiments, the volume of the environmentally responsive hydrogel polymer layer is controlled by a stimulus or by a combination of stimuli selected from the group consisting of moisture change, temperature change, pressure change, magnetic field change, electrical field change, pH change, light intensity change, chemical species concentration change and ion concentration change.

In some embodiments, the apparatus further comprises an additional substrate with a surface.

BRIEF DESCRIPTION OF THE DRAWINGS

Various objects, features, and advantages of the present invention can be more fully appreciated with reference to the following detailed description of the invention when considered in connection with the following drawings, in which like reference numerals identify like elements. The following drawings are for the purpose of illustration only, are not to scale, and are not intended to be limiting of the invention, the scope of which is set forth in the claims that follow.

DETAILED DESCRIPTION OF THE INVENTION

The invention is based, in part, on the discovery that an environmentally responsive hydrogel polymer can be used to reconfigure microactuators by activating or de-activating their optical response in reaction to a change in the environment, thereby changing the optical properties of the material. Such activation or de-activation does not require an external power source and is therefore advantageous for many applications, for example applications for which external energy is unavailable, limited or undesirable.

The patent and scientific literature referred to herein establishes knowledge that is available to those of skill in the art. The issued U.S. patents, published U.S. applications, published foreign applications, and references that are cited herein are hereby incorporated by reference to the same extent as if each was specifically and individually indicated to be incorporated by reference.

As used herein, the recitation of a numerical range for a variable is intended to convey that the invention may be practiced with the variable equal to any of the values within that range. Thus, for a variable which is inherently discrete, the variable can be equal to any integer value within the numerical range, including the end-points of the range. Similarly, for a variable which is inherently continuous, the variable can be equal to any real value within the numerical range, including the end-points of the range. As an example, and without limitation, a variable which is described as having values between 0 and 2 can take the values 0, 1 or 2 if the variable is inherently discrete, and can take the values 0.0, 0.1, 0.01, 0.001, or any other real values $\geq 0$ and $\leq 2$ if the variable is inherently continuous.

As used herein, unless specifically indicated otherwise, the word "or" is used in the inclusive sense of "and/or" and not the exclusive sense of "either/or."

As used herein "optically active" or "optical" refers to responsive microactuators and their arrays that exhibit a change in their optical properties such as transmittance, reflectance, refraction, color, absorption, diffraction, interference, luminescence, fluorescence and any combination thereof in association with the change in their orientation, geometry, arrangement, periodicity, stiffness, swelling/contraction or any other physical or geometrical property.

Environmentally responsive optical microstructured hybrid actuator assemblies, also referred to as optically active microactuator arrays, are described. A volume-phase transition of environmentally responsive hydrogel is employed to induce reversible directional bending of an optically active microactuator array (e.g., a micromirror array) resulting in the switching of the angle-dependent reflectivity or color or other optical property of the hybrid assembly.

Figure 3A:
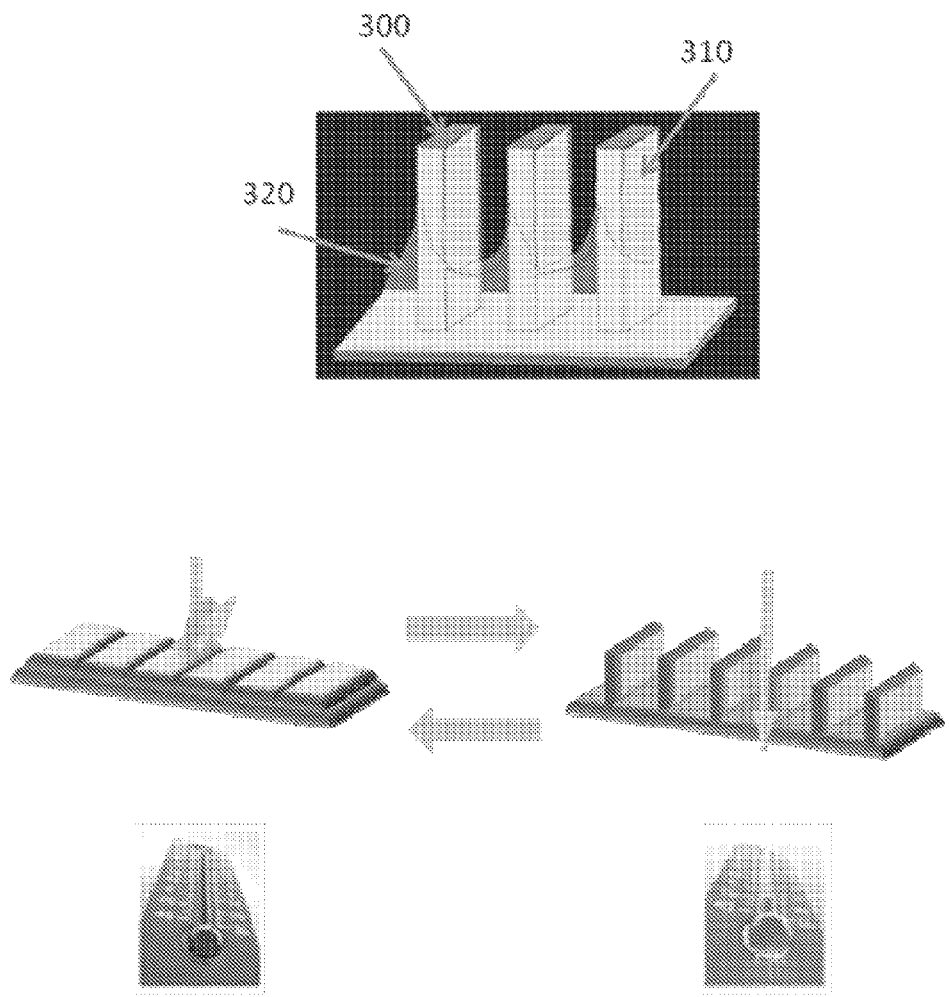
FIG. 3A is a graphical representation of an illustrative optically active microactuator array according to one embodiment of the invention which is reflective at high temperature (left) but becomes transmissive at lower temperature (right).

Referring to FIG. 3A, an optical microstructured hybrid actuator assembly includes an arrangement of microactuators 300 having different surface characteristics 310 when viewed from different angles. The microactuators are in contact with an environmentally responsive hydrogel 320. When the hydrogel transitions from a fully expanded to a contracted state, the change in volume exerts a mechanical force on the microactuators that causes them to tilt or bend, so that the surface characteristic of the microactuators changes, as viewed from a fixed angle.

In some embodiments, the hybrid assembly includes a substrate having a uniform or non-uniform coating or layer of an environmentally responsive hydrogel. A plurality of microactuators are positioned on the surface and in contact with the hydrogel to provide a desired visual effect in a resting state. For example, the microactuators can be arranged in a fully swollen hydrogel to provide a translucent or transparent transmissive surface.

Figure 3B:
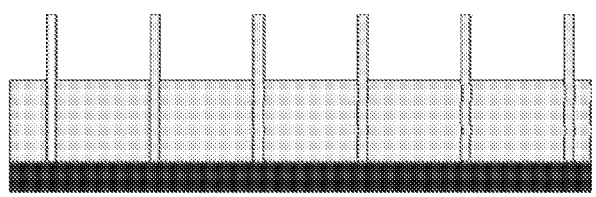
FIG. 3B is a graphical representation of how the optically active microactuators (referred to in the figure as "structures") can be positioned relative to the environmentally responsive hydrogel polymer and the substrate according to one embodiment of the invention.
Figure 3B:
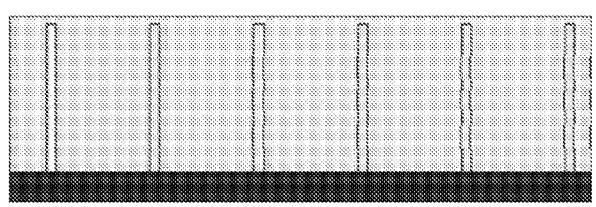
Figure 3B:
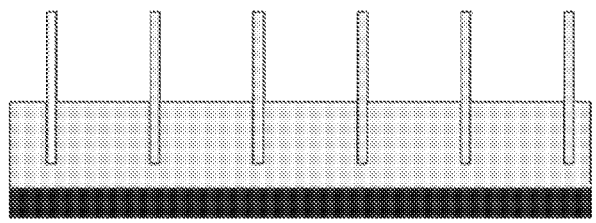
Figure 3B:
Figure 3C:
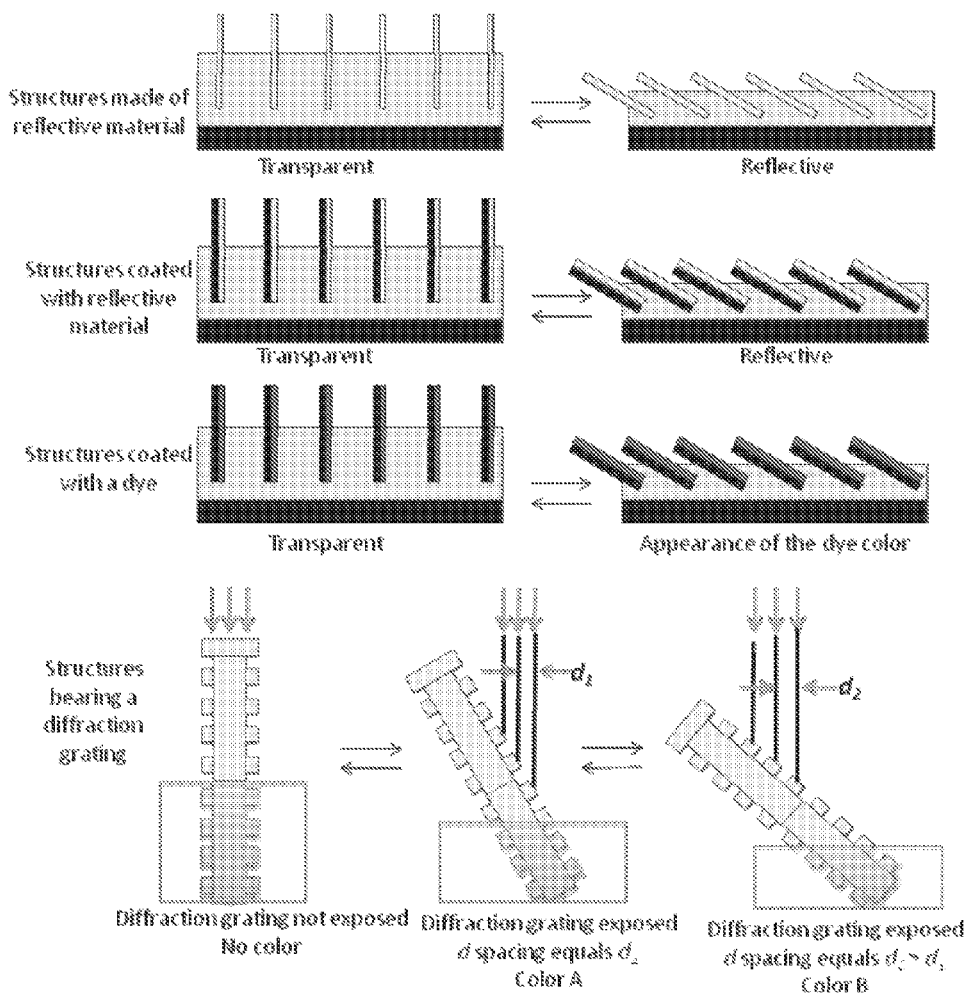
FIG. 3C is a schematic of the operation of illustrative optically active microactuator arrays having different types of optically active microactuators according to one embodiment of the invention.

In some embodiments, the optically active microactuators include a surface treatment or an additional colored layer that is observable only when the microactuators are bent or tilted. This is illustrated in FIG. 3C.

In some embodiments, the optically active microactuators are embedded in the hydrogel layer and spaced apart from the substrate. In some embodiments, the microactuators are integral with or attached to the substrate. This is illustrated in FIG. 3B.

Figure 14:
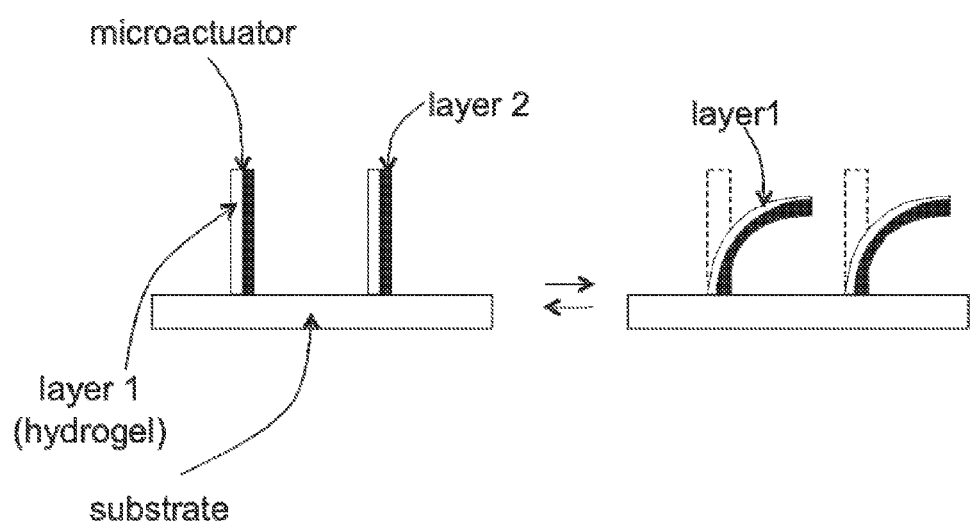
FIG. 14 illustrates actuation of an actuator comprising two-layered structure of which at least one layer is made of a responsive material according to one embodiment of the invention.

In some embodiments, the microactuators comprise a high-aspect-ratio responsive material itself (e.g., a hydrogel) with an attached second layer or a surface coating that will be actuated by deformation of the structure due to the volume changes in the responsive material layer. This is illustrated in FIG. 14.

Optically Active Microactuators

Optically active microactuators can be made with various geometries of the microactuators (posts, blades, cones, pyramids, inverted cones, and the like), which allow one to fine-tune the degrees and modes of tilting/bending. Optically active microactuators of different shapes and arrangements can be used in the same microactuator array.

When the microactuators bend, tilt, swell/contract, or are deflected, twisted, or deformed, they move to a position between a first position (e.g., from an angle equal to or greater than 0 degree to the substrate in the case of bending or deflection) and a second position (e.g., to an angle equal to or smaller than 90 degree to the substrate in the case of bending or deflection), such that the angle of the structures relative to the supporting substrate changes. The dimension of structure perpendicular to the substrate will determine, in part, the extent of the lateral displacement experienced by the structure. Thus, for example, for a linear structure initially perpendicular to a surface and then deflected by an angle $\theta$, the displacement of the structure over the underlying substrate is defined by the length of the structure/and the angle $\theta$ according to the equation $l \cdot \cos \theta$.

In some embodiments, the microactuators have a dimension, e.g., length, perpendicular to the substrate in the range of 1 μm to about 1 mm, or about 1-10 μm, 10-100 μm, 100-500 μm, 500-1000 μm, or any range in-between.

The microactuators can have a symmetric or asymmetric cross-section. And for example, the microactuators can have a round, square, oval or rectangular cross-section, or an irregularly shaped cross section, or the combinations of such cross-sections. In some embodiments, the actuator structures have a cross-sectional thickness in the range of 10 nm to 1000 μm, and can be 1-5 μm, 5-10 μm, 10 μm-100 μm, 100 μm-1000 μm, or any range in-between.

In some embodiments, the vertical cross-sections of optically active microactuators normal to the substrate are aspected and the aspect ratio is in the range of 1:1 to 1:100, or 1:5, or 1:10. In some embodiments, the cross-sectional dimensions of optically active microactuators have step-wise or continuous gradient along the axis from the substrate to the top of microactuators. In some embodiments, the optically active microactuators are aspected between the cross-sectional dimension and the height in the range from 1:0.5 to 1:100. The thickness of the actuator plays a role in the ability of the actuator to bend when a bending force is applied.

Figure 13:
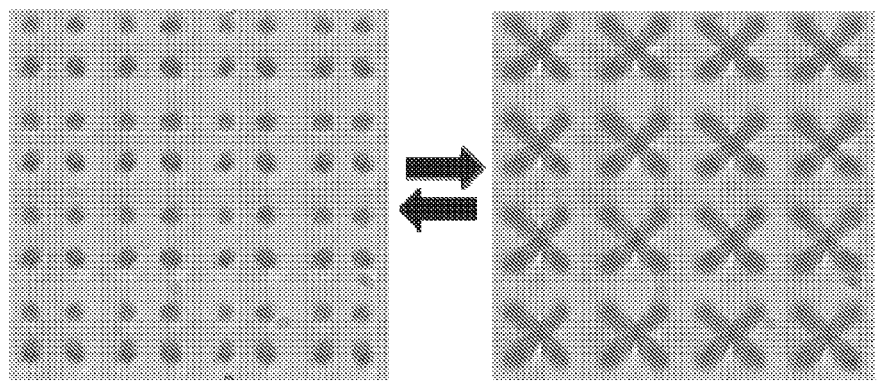
FIG. 13 is an exemplary optical microscope image showing cross-actuation of four adjoining micropillars according to one embodiment of the invention.

In some embodiments, the optically active microactuators are assembled in a pattern and can form a new pattern upon actuation, for example, four or six posts arranged in a square array or a hexagonal array can cluster into a "crossed" form of four or six posts to give rise to optical change, as illustrated in FIG. 13.

In some embodiments, groups of the optically active microactuators can be arranged on a substrate in a way to create letters, patterns, or certain desired two-dimensional shapes. In these embodiments, an apparatus comprising such microactuators can be used to display (or to cease displaying) something written upon actuation, e.g., "STOP".

Figure 12:
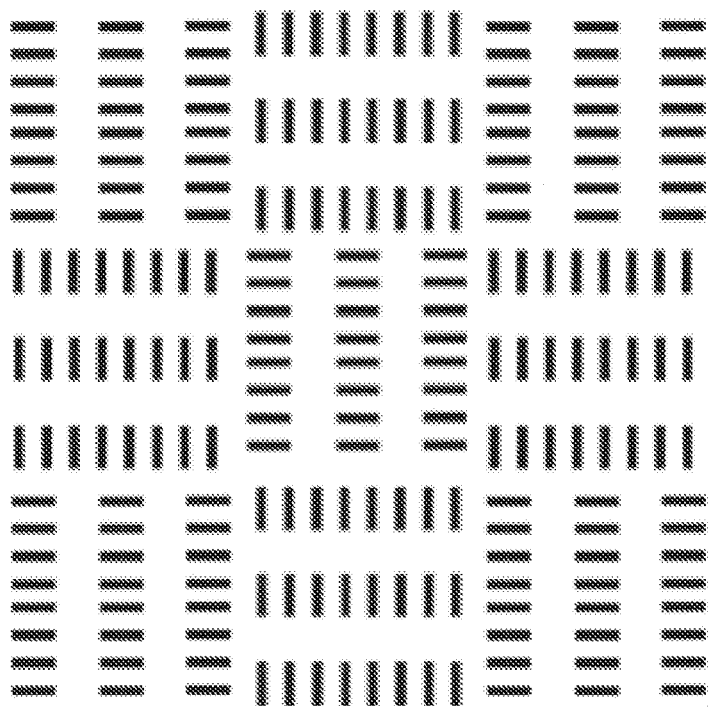
FIG. 12 illustrates an exemplary pattern (top view) of a microactuator array with uni-directionally oriented plates in sections according to one embodiment of the invention.

In some embodiments, hydrogels on a homogeneous array of an optically active microactuator can be patterned in a way to create letters, patterns, or certain desired two-dimensional shapes. An example of such pattern is provided in FIG. 12.

Microactuator Arrays

Spatial patterning of optically active microactuators into microactuator arrays (such as stripes, sections, etc.) allows design of optical microactuator arrays suitable for specific purpose.

FIGS. 2A and 2B show an exemplary structure of an optically active microactuator array, a staggered array. A staggered array can be useful for full coverage of a surface (maximum reflectance or color intensity).

In a staggered array, the optically active microactuators are arranged in row at regularly spaced intervals. Each row is offset by a set distance from the proceeding row, such that diagonal columns are formed. A staggered array is useful when actuation is designed to alter the material from transmissive to reflective or reflective to transmissive, with tunable contrast ratios that are greater than 20%, 30%, 40%, 50%, 60%, 70%, 80%, 90, 95% or 99%, or with contrast ratio of 100%.

FIG. 2A shows the top view of a microplate layout, where T: thickness, L: length, G: gap, S: separation, D: etch depth (corresponds to the height of each microplate). In one exemplary embodiment, T=2 µm, L=10 µm, G=5 µm, S=5 µm and D=15 µm. FIG. 2B shows a scanning electron microscope (SEM) image showing a micromirror array fabricated by shadow deposition of silver onto the blades at an angle. The arrow indicates the direction of silver flume during the metallization. When the array is bent, the offset actuators overlap one another and provide a full coverage of the underlying surface. Metalization can be done on a PDMS mold followed by the removal of excess metal on the surface then transferring the metal onto each microplate cast in the PDMS mold to increase the contrast ratio as shown in FIG. 2C.

In some embodiments the distance between individual microactuator rows in the array is from 1-10 µm, 10-25 µm, 25-50 µm, 50-100 µm, or 100-1000 µm. In some embodiments, the spacing (gap) between individual microactuator elements in each row is from 0.1-10 µm, 10-25 µm, 25-50 µm, 50-100 µm, or 100-1000 µm.

In some embodiments, the distance between adjacent microactuator in a random arrangement is varied proportionally to the height of the microactuator so that the overalp between the adjacent pair of microactuators in bent or tilted state is from 0 to 90% of the height of the micro actuators.

In some embodiments, the distance between adjacent microactuator in a random arrangement is varied proportionally to the height of the microactuator so that no overlap between the adjacent pair of microactuators is created when bent or tilted.

In some embodiments, the microactuators can be arranged in rows and columns. When the array is deflected, the bent microactuators form deflected (reflecting) bands and non-reflecting (surface) bands.

In some embodiments, the microactuators can be arranged along the perimeter of a closed shape (e.g. triangle, square, rectangle, pentagon, hexagon, honeycomb, circle, ellipse, or polygonal shape). When the array is deflected, the bent microactuators cover the open area inside a closed shape turning the entire closed shape from a transparent/translucent surface to a opaque/reflecting surface.

In some embodiments, the microactuators can be arranged along the perimeter of a closed shape (e.g., triangle, square, rectangle, pentagon, hexagon, honeycomb, circle, ellipse, or polygonal shape) enclosing a set of letters, colors, patterns, graphics, or signs. When the array is deflected, the bent microactuators mask the enclosed object, otherwise the enclosed object is revealed.

In some embodiments, the microactuators can be arranged in a pattern, so that an image, design or a pattern is observed upon actuation. Such optical switching of the surface appearance could be applied to make dynamic aestetic materials, jewelry and structures that change color or reveal new patterns upon the change in environment.

In some embodiments, a group of unidirectionally aligned microactuators can be arranged in a pattern, within which the orientation of each microactuator is the same, such that the angle of orientation for each section is different so that directional optical effect can be created upon actuation.

Striped or any other partial or patterned arrays are useful to provide an intermediate response of the hybrid microactuator assembly.

In some embodiments, the optically active microactuators of different shapes can be grouped and placed on a same substrate to form patterns (e.g., letters or symbols) to present letters, symbols, graphics, and signs.

In some embodiments, the optically active microactuators are placed on a curved surface. When the array is deflected, the bent microactuators change the appearance and the texture of the curved surface by changing the local effective refractive index and reflectivity.

Optical Coatings and Diffraction Gratings

Optical coatings or a second layer that can be used to impart optical properties onto the microactuators include, but are not limited to, reflective materials, metal oxides, infrared reflecting materials, pigments, multi-layer reflectors, gratings, rare earth-based and other luminescent materials, fluorescent dyes, bioluminescent materials, quantum dots, plasmonic materials, and photonic crystals. Illustrative examples thereof are provided in FIG. 3C.

In some embodiments, the microactuators in the microactuator arrays are coated with a reflective material to form a mirror or other reflective surface to selected wavelengths or regions of the spectrum of incident light. Thus, if the microactuators are oriented so that they do not reflect light (e.g., the light passed by them as illustrated in FIG. 3A), the microactuator array will appear transparent. Upon actuation, the microactuators in the array tilt or bend so that the reflecting surface is now presented to the viewer or blocks the incoming light to the viewer behind the microactuators. The mirrored surfaces reflect the light and cause the microactuator array to appear opaque or dark.

Exemplary materials for use as reflective materials include silver, aluminum, gold, copper, other metals, some metal oxides (e.g., titania, zinc oxide, tungsten oxide, silica, alumina), other inorganic compounds of low solubility, reflective particle-containing coatings, nanocomposite coatings, conducting polymers with appropriate adhesion layer of 10 nm or less. The choice for an adhesion layer for a given material is well known in the art and unless specified, all the reflective coating materials described here will be deposited with a proper adhesion layer as is well known in the art.

In some embodiments, the microactuators in the microactuator arrays are coated with an absorbing material to selected wavelengths or regions of the spectrum of incident light. Thus, if the microactuators are oriented so that they do not absorb light (e.g., the light passed by them as illustrated in FIG. 3A), the microactuator array will appear transparent. Upon actuation, the microactuators in the array tilt or bend so that the absorbing surface is now presented and absorbs the incoming light. The exposure of the absorbing surfaces cause the microactuator array to appear opaque or dark.

In some embodiments, the side walls of the microactuators in the microactuator arrays are coated with a dye, pigment, or other color coating. Thus, if the microactuators are oriented up-right (e.g., the light passed by them as illustrated in the third schematic in FIG. 3C), the microactuator array will appear transparent and nearly colorless.

Upon actuation, the microactuators in the array tilt or bend, so that the colored side walls of the microactuator are visible to the viewer and the surface will appear colored. Exemplary materials for use as a colored coating include metals, metal oxides, mixed metal oxides, other inorganic compounds of low solubility, organic materials, dyes having different colors, which can be used as a coating with and/or without a carrier matrix, metal nanoparticles, semiconducting nanoparticles, carbon black, and any other colored coating.

In some embodiments, the microactuators themselves are made in full or in part from an environmentally responsive hydrogel. A second layer or an optical coating can be applied as illustrated in FIG. 14. In this case, the volume change occurring only in the hydrogel part deforms the microactuators to reversibly reveal or hide the optical coating layer to give rise to an optical effect.

In some embodiments, the microactuators themselves are made entirely of a colored material, such as colored polymers, thermochromic polymers, photochromic polymers, polymer blends and polymers with fillers. In the latter case, no additional coating is required to expose the colored surface, though it can be applied if a mixed optical effect is desired.

Colored polymers and colored fillers that can be used to make colored polymers are well known in the art. Examples of color polymers include, but are not limited to, those described in Beaujuge and Reynolds, "Color Control in π-Conjugated Organic Polymers for Use in Electrochromic Devices" *Chem. Rev.* 2010, 110: 268-320; U.S. Pat. No. 4,242,499; U.S. Pat. No. 6,040,005, each of which is incorporated by reference herein in its entirety. Examples of colored fillers in polymers include, but are not limited to, those described in U.S. Pat. No. 6,333,043, which is incorporated by reference herein in its entirety.

Diffraction gratings can also be used to impart optical properties onto the microactuators. Formation of diffraction gratings on microscale objects is known and can be accomplished, for example, by sequentially depositing a coating of different thicknesses that corresponded to a wavelength of light. Diffraction gratings can be imparted on the microactuators during or after the manufacturing process. Dry etching or wet etching can be used to etch diffraction gratings in to the microactuators during their manufacture process. An example of such etching technique is called the Bosch process and is well known in the art. An example of an actuator with a diffraction grating is shown in FIG. 3C.

The periodic etching and re-coat of the structures during this process leaves behind a periodic undulation pattern on the side walls of the produced structures (so-called, scalloping) that can be optimized as an amplitude grating to correspond to the wavelength of visible light. As illustrated in the forth schematic in FIG. 3C, when the microactuators are oriented up-right in the swollen hydrogel polymer, the diffraction grating is not exposed, and the surface appears colorless; when the microactuators bend, they begin to expose the grating. Importantly, the resulting color will be highly tunable, as the d-spacing in the exposed diffraction grating will depend on the tilt angle of the structures, and can be controlled by the volume change of the contracting hydrogel polymer.

Materials exhibiting structural colors (e.g. photonic crystals such as opal, colloidal assembly, inverse opal) and plasmonic colors (e.g. metal nanoparticles), and combinations of them can also be used to impart photonic and plasmonic properties onto the microactuators. In particular, photonic crystals are known to show angle-dependent structural colors and can be accomplished, for example, by self-assembly or co-assembly of colloidal particles of different size and material, and by inverting their structures. Such techniques are known in the art.

In some embodiments, the sidewall of the microactuators can be coated by a stack of thin films of one or more materials with different refractive index to form multilayer reflector or Bragg stack. Techniques to coat microactuators with such optical multilayers are known in the art such as chemical vapor deposition, physical vapor deposition, surface sol-gel, electrodeposition, and electroless deposition.

Environmentally Responsive Polymers

Environmentally responsive hydrogel polymers are well known in the art. The following are merely examples of suitable environmentally responsive hydrogel polymers, but are only a small sampling of the environmentally responsive hydrogel polymers that could be used.

Polymers responsive to temperature, pH, light, electric field, chemicals and ionic strength are described in Jeong and Gutowska, "Lessons from nature: stimuli-responsive polymers and their biomedical applications," *TRENDS in Biotechnology*, 20, pp. 305-311 (2002) and in de las Heras Alarcon et al., "Stimuli responsive polymers for biomedical applications," *Chem. Soc. Rev.* (2005), 34:276-285; Richter et al., "Review on Hydrogel-based pH Sensors and Microsensors," *Sensors* 2008, 8:561-581, US 2005/0024730, all of which are incorporated by reference herein in their entirety.

Specific non-limiting examples of pH-sensitive hydrogels include polymers of hydroxyethyl methacrylate-co-methacrylic acid and tetraethylene glycol dimethacrylate. These polymers may swell substantially more under basic conditions than under acidic conditions. Alternately, some hydrogels can swell and contract significantly in response to changes of a metal ion concentration in a fluid located thereby, e.g., a variation in a Cu, Ni, Co, and Pd ion concentration. Examples of such metal ion-sensitive hydrogels include polymers of acryl amide-co-2-vinylpyridine and N,N'-methylenebisacrylamide.

Temperature Responsive Hydrogels

Temperature responsive hydrogels are a subset of environmentally responsive hydrogel polymers that undergo a change in phase (e.g., volume) with a change in temperature. Temperature responsive hydrogels have been described in Bromberg and Ron, "Temperature-responsive gels and thermogelling polymer matrices for protein and peptide delivery," *Adv. Drug Deliv. Rev.* 31 (1998), pp. 197-221; Jeong et al., "Thermosensitive sol-gel reversible hydrogels," *Adv. Drug Deliv. Rev.* 54 (2002), pp. 37-51; Galaev and Mattiasson, "Thermoreactive water-soluble polymers, nonionic surfactants, and hydrogels as reagents in biotechnology," *Enzyme Microb. Technol.* 15 (1993), pp. 354-366, all of which are incorporated by reference herein in their entirety.

The transition temperature known as the lower critical solution temperature (LCST) can be tuned over a wide range (for example, but not limited to, 15°-45° C.). Additionally, the transmittance of the temperature-responsive gel decreases when the temperature is above the LCST and increases when the temperature is below the LCST. This effect is added to the changes in the transmittance and the texture of the hybrid assembly when a thick (>1 μm) layer of hydrogel is used for device fabrication.

Figure 1:
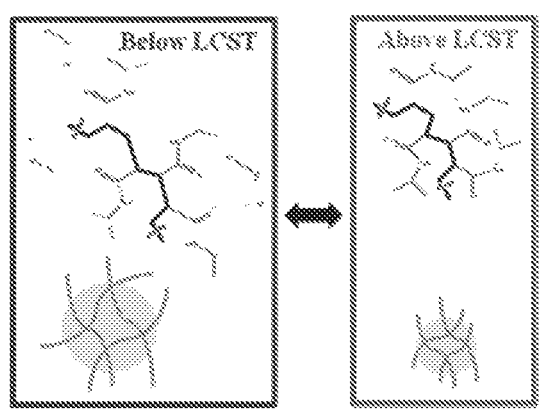
FIG. 1 is a schematic representation of the volume-phase transition in a temperature-responsive hydrogel according to one embodiment of the invention.

FIG. 1 is a schematic representation of the volume-phase transition in a temperature-responsive hydrogel. Below the lower critical solution temperature (LCST), the polymer is hydrophilic and water molecules can be hydrogen bonded to the polymer gel network. Therefore, the polymer gel swells and maintains a high water content. The effective refractive index of the gel at this state is closely matched with the surrounding water and the transmittance is high. Above the LCST, the polymer becomes hydrophobic and the hydrogen bonding of water molecules breaks up. The water molecules leave the polymer gel network due to the gain in entropy and the gel collapses to microscale aggregates which scatter light due to mismatch in the refractive index with surrounding water. Thus, temperature sensitive hydrogels can be cycled between states of high volume, high transmittance and low volume, low transmittance with a change in temperature. A similar transition is experienced by altering other environmental conditions, e.g., pH, light, electric field, chemicals and ionic strength, for environmentally responsive hydrogels.

Specific examples of temperature-responsive hydrogels include, but are not limited to: (i) Poly(N-isopropylacrylamide) and its co-polymers (PNIPAm)—

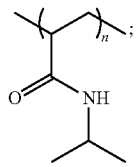

co-monomers may include acrylic acid, acrylamide, various acrylates, etc.; various cross-linkers can be used; (ii) other poly(N-alkylacrylamides) and their co-polymers, e.g., Poly (N,N-diethylacrylamide (PDEAAm)

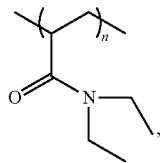

Poly (N-vinyl caprolactam) (PVCL)

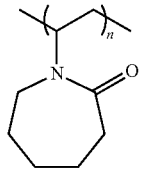

(iii) block-copolymers of ethyleneoxide and propyleneoxide (known as Pluronics, poloxamers, Tetronics) with LCSTs between 20 and 85° C., e.g.,

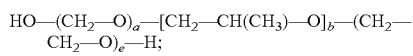

(iv) various combinations of these types of building blocks, such as graft copolymers exhibiting both pH and temperature responsiveness e.g., those described in Chen and Hoffman "Graft copolymers that exhibit temperature-induced phase transitions over a wide range of pH", Nature 373: 49-52 (1995);

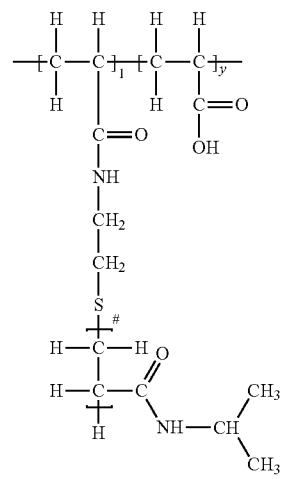

PNIPAAm-g-PAAc (v) copolymers of 2-(2-methoxyethoxy)ethyl methacrylate (MEO$_2$MA) and oligo(ethylene glycol) methacrylate (OEGMA) with a highly tunable LCST between 26 and 90° C. like those described in Lutz et al., "Point by Point Comparison of Two Thermosensitive Polymers Exhibiting a Similar LCST: Is the Age of Poly(NIPAM) Over?" *J. Am. Chem. Soc.* 2006, 128, 13046-13047;
(vi) polysaccharides; and
(vii) copolymers of ethyleneoxide with lactic acid-co-glycolic acid.

LCST for exemplary polymeric materials are shown in Table 1 (from Jeong et al., *Advanced Drug Delivery Reviews* 54 (2002) 37-51).

TABLE 1

Polymers showing a LCST in water

| Polymer | LCST (° C.) |
|---|---|
| Poly(N-isopropylacrylamide), PNIPAM | ~32 |
| Poly(vinyl methyl ether), PVME | ~40 |
| Poly(ethylene glycol), PEG | ~120 |
| Poly(propylene glycol), PPG | ~50 |
| Poly(methacrylic acid), PMAA | ~75 |
| Poly(vinyl alcohol), PVA | ~125 |
| Poly(vinyl methyl oxazolidone), PVMO | ~65 |
| Poly(vinyl pyrrolidone), PVP | ~160 |
| Poly(silamine) | ~37 |
| Methylcellulose, MC | ~80 |
| Hydroxypropylcellulose, HPC | ~55 |
| Polyphosphazene derivatives | 33-100 |
| Poly(N-vinylcaprolactam) | ~30 |
| Poly(siloxyethylene glycol) | 10-60 |

Selection of Appropriate Environmentally Responsive Polymers

Suitable environmentally responsive polymers will respond to the environmental stimulus with a volume-phase transition suitable to induce reversible directional bending or tilting of an optically active microactuator array (e.g., a micromirror array) that will result in the switching of the reflectivity of the hybrid assembly when viewed at a fixed angle.

For example, it is known that PNIPAm has a relatively slow kinetics (Hoffman et al., *J. Controlled Release* 1986, 4, pp. 213-222), while cross-linked poly(vinyl methyl ester) has a much faster response (Kabra et al., *Polymer* 1992, 33: 990-

995). Linear PNIPAm oligomers grafted to existing crosslinked hydrogels can enhance the response rate even more (Yoshida et al., *Nature*, 1995, 374: 240-242; Kikuchi and Okano, *Adv. Drug Delivery Rev.*, 2002, 54: 53-77; Arnott, et al., "Agarose double helix and its function in agarose gel deswelling response to temperature changes," *J. Mol. Biol.* 90 (1974), pp. 269-284; Rees ad Welsh, "Secondary and tertiary structure of polysaccharides in solutions and gels," *Angew. Chem. Int. Ed. Engl.*, 16 (1977), pp. 214-224).

Polymers with more than one transition states are known (See Jeong and Gutowska (2002)) and can optionally be utilized as well.

In some embodiments, different types of stimuli (temperature, light, pH, humidity) and their combinations can be envisioned as the drivers of the polymer volume transition to make the optical microstructured hybrid actuator assemblies responsive to a combination of stimuli. Copolymers sensitive to different stimuli can be prepared using techniques known in the art.

Operation of Optical Microstructured Hybrid Actuator Assemblies

An advantageous aspect of the optical microstructured hybrid actuator assemblies is that, in some embodiments, no external power is required for actuation. In some embodiments, the actuation is reversible.

FIG. 3A shows the schematics of the operation principle of the hybrid actuator in connection with a temperature responsive hydrogel. The hybrid actuator includes a series of microactuators 300 with a reflective surface 310 embedded in a responsive hydrogel 320. When the temperature of the environment is below the LCST (right), the gel swells and no strain is applied to the optically-coated hybrid actuator (micromirror). Therefore, the optically-coated microactuators are standing up-right allowing maximum light transmission.

When the temperature is above the LCST (left), the gel contracts and puts strain on the optically-coated microactuators. The optically-coated microactuators are bent and the reflectivity increases. The bending orientation of the optically-coated microactuators is biased by the symmetry of the microactuator array and the anisotropic pattering of the temperature-responsive hydrogel by shadowed UV-curing, as shown in FIG. 3B, bottom.

The anisotropically-positioned gel on one side of the plates can be achieved by shadow UV-curing or by anisotropic control of the wetting property of the hydrogel precursor solution onto the microactuator surface, which selectively puts more (or less) hydrogel on a good (or poor) wetting surface. For example, the aqueous hydrogel precursor solution exhibits good wetting on silver-coating while it shows poor wetting on gold-coating. In another example, aqueous hydrogel precursor solution exhibits good wetting on UV-treated titanium dioxide-coating while it shows poor wetting on unexposed titanium dioxide-coating. A very thin layer of silver (less than 5 nm) sputtering can improve the wetting of the aqueous hydrogel precursor solution onto the entire microactuator surface. After shadowed evaporation of a thick silver coating (typically 200 nm), a surface passivation layer of aluminium (10 nm) followed by a thin layer of gold (less than 10 nm) can be shadow evaporated under the same condition to reduce the wetting of the hydrogel precursor solution on the coated surface.

Figure 3D:
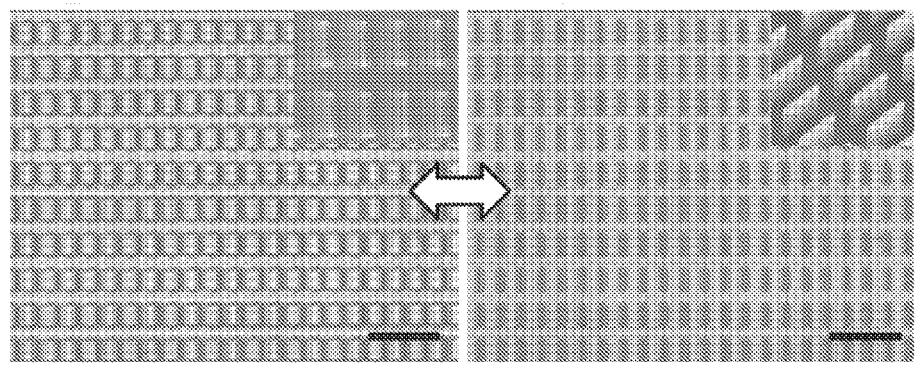
FIG. 3D shows optical microscope images depicting the top views of a bent (left) and up-right (right) configurations of a micromirror array according to one embodiment of the invention, shown inset are scanning electron microscope images.

FIG. 3D shows optical microscope images showing the up-right (right) and bent (left) configurations of an exemplary optically-coated microactuator array. The length of each optically-coated microactuator is 10 µm.

In some embodiments, the apparatus as described herein may achieve very fast response times. For instance, when a water droplet is placed on a humidity-responsive hydrogel polymer layer in a contracted state, such as that shown in FIG. 5B, it may take only about 60 milliseconds to move to an expanded state, such as that shown in FIG. 5A. Additionally, the reverse transformation of the polymer layer back to the contracted state may only take about 4 seconds, if unassisted by drying. Obviously, this time would be greatly accelerated if the drying process were facilitated using airflow in the system and/or by increasing the temperature. It is believed that similar switching speeds might be obtained for all the various embodiments of the present invention.

As a result of actuation, microactuators can bend or tilt, or bend and tilt, or bend and twist, or bend and buckle. If the microactuators are attached to a substrate (e.g., a surface), they will bend. If, however, the microactuators are not connected to a substrate, they will tilt. In both cases, if the hydrogel contraction puts very high mechanical stress, the structures can buckle or twist. Other parameters can also be controlled to adjust the bend/tilt balance. For example, if microrods are used as the microactuators, the top part of the microrod (not attached to a surface) can be made softer than the bottom part to amplify bending. Conversely, to reduce bending and to facilitate straight tilting, the anchoring point of a microrod (i.e., the portion of the rod that is attached to a surface) can be made soft, which will amplify tilting of the rod in response to actuation.

The shape of the microactuator also affects the degrees of bending and tilting. For example, a conical structure will have stronger connection to the substrate and would favor bending (over tilting) because of its more flexible tip.

For example, when a microactuator is manufactured, silicon can be etched, coated again and etched again. Multiple such cycles can be utilized. The lines of the surface of the structure can be designed to reflect a particular wavelength of light of interest.

The shape of the microactuator also affects the orientation of the bending and tilting. For example, a plate structure with a slight curvature (e.g. 'C' shape pillars) will preferentially bend toward the high curvature area.

The speed of the transition of the polymer from below LCST to above LCST can be used to manipulate tilt angles of the microactuators, which can be useful for adaptive optics, e.g., variable tilting angle of reflectors or gratings.

The volume change of the polymer responding to the environmental conditions can be used to manipulate tilt angles of the microactuators. For example, polymer responding to the humidity change will have different degrees of contraction depending on the external humidity level; similarly, depending on the slight changes of the temperature close to LCST, the contraction of the temperature-responsive polymer will be different. The resultant microactuator array will therefore exhibit different tilt angles, which, in turn, will manifest itself in different optical properties (such as color, color saturation, transmission, reflectivity and the like).

In some embodiments, the substrate is a transparent plate and the polymer with embedded microactuators is placed between two plates of glass or a transparent polymer. In some embodiments, two pieces of the embedded microactuators placed on a glass or transparent polymer plate can be assembled to face the microactuators each other with a spacer thicker than the sum of the height of each microactuators in order to confine water between the two pieces of the microactuators. In some embodiments, the transparent polymer is Plexiglas®.

The microactuators embedded in a temperature-responsive hydrogel can be actuated by using photothermal actuation. A thin layer of gold can be coated on the microactuators as a near-infrared light absorber. Composites of gold nanorods and polymer can be prepared to create the microactuators and/or temperature-responsive hydrogels to carry near-infrared light absorbing materials. In both cases, the microactuators can be quickly switched on and off by irradiating a small area using a near-infrared laser.

Figure 15:
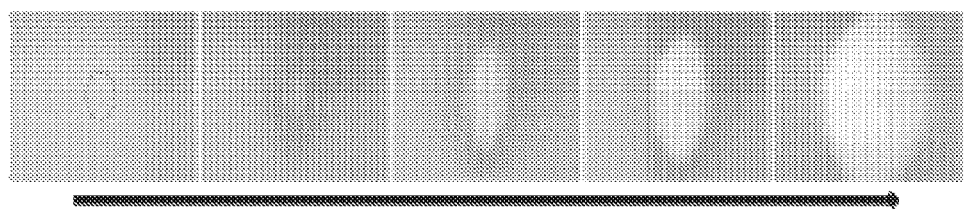
FIG. 15 are optical microscope images illustrating photothermally actuated micromirror actuator array according to one embodiment of the invention.

An exemplary actuation sequence using this photothermal actuation is shown in FIG. 15. The (elliptical) dotted area was initially irradiated with a near-IR laser (910 nm) to locally and photothermally actuate the mirrors. Each image is taken every 15 second after the beginning of the laser irradiation. Upon turning off the laser, the deformed micromirrors reconfigure to upright configuration within a few seconds (not shown).

Applications of Optical Microstructured Hybrid Actuator Assemblies

Optical microstructured hybrid actuator assemblies can be useful in self-regulating smart windows (requiring no external power source). In such case, the substrate(s) are made out of glass or other transparent polymer(s), or a transparent polymer(s) attached to glass. Plexiglas® is a non-limiting example of such transparent polymer. The hybrid actuator assemblies (microactuator arrays in a responsive hydrogel polymer layer) are coated on one side of the glass surface and include a cover glass layer to protect and isolate the hybrid assembly from the environment. The hybrid assembly can be responsive to temperature, light, or both, so that the microactuators move from a first transmissive state to a second state that is for example, opaque so that light does not transmit through the window, or reflective, so that light is reflected from the window surface. Therefore, the self-regulating smart windows can adaptively and actively control the shading and thermal gain of a space, room, building roofed/windowed/or enclosed by themselves.

Of particular interest in smart windows applications are micromirror arrays embedded in a temperature-responsive gels with the LCST in the range of 25-35° C. Such windows will be transparent and let the light pass through at low environmental temperatures, but will switch to a reflective state at hot temperatures that pass the comfort heat level, thus reducing the heat transport through the window. Compared to various static anti-reflective coatings applied to windows, which reduce the light transmission both during the hot summer months (beneficial mode) and during chilly, but sunny winter months (negative mode), our dynamic antireflective microactuator arrays will only reflect light at high temperatures.

Optical microstructured hybrid actuator assemblies can be used as a sensor in temperature controllers, e.g., in climate controls or energy-efficient smart buildings. For example, a temperature above the desired temperature could make the microstructured hybrid actuator assembly opaque and thereby automatically trigger a cooling cycle. On the other hand, a temperature below the desired temperature could make the microstructured hybrid actuator assembly transparent and thereby automatically trigger a heating cycle.

Optical microstructured hybrid actuator assemblies can be used for adaptive and intelligent cosmetics and jewelry (e.g., artificial nails and jewelry that change color, reflectivity in response to the environment, body temperature, amount of room light, humidity (including ambient humidity), UV ray intensity, moisture and oil level of skin, etc.).

Optical microstructured hybrid actuator assemblies can be used for adaptive and self-reporting/protecting packaging material. Examples include packaging for temperature-sensitive goods, light-sensitive goods, packaging that indicates whether the product has been spoiled (by detecting change in pH or temperature).

Contemplated applications of self-reporting/protecting materials further include protection of cultural properties, paintings, etc. In an example of such application, heat or UV light would render a microstructured hybrid actuator assembly covering the painting opaque, thereby reducing or eliminating its exposure to damaging UV light.

Optical microstructured hybrid actuator assemblies can be incorporated into an aquarium or a terrarium to modify the amount of light reaching the aquarium or terrarium.

Optical microstructured hybrid actuator assemblies can be used for road signs and road studs (e.g., when outside temperature falls below freezing, the optical microstructured hybrid actuator assemblies could be used to display a sign for motorists alerting them to potentially icy road conditions; when the temperature returns to above freezing, the sign would disappear). Optical microstructured hybrid actuator assemblies can be used for weather signs with a single or multiple types of outputs (cold, ice, humid, etc.)

Optical microstructured hybrid actuator assemblies can be used in decorative art (e.g., to cover sculptures, walls of the buildings, etc.) and/or can be utilized for purely aesthetic purposes as dynamic, optically switchable pieces that change color, reveal pattern, etc.

Manufacture of Optical Microstructured Hybrid Actuator Assemblies

Optical microstructured hybrid actuator assemblies can be manufactured as illustrated herein below.

Figure 6:
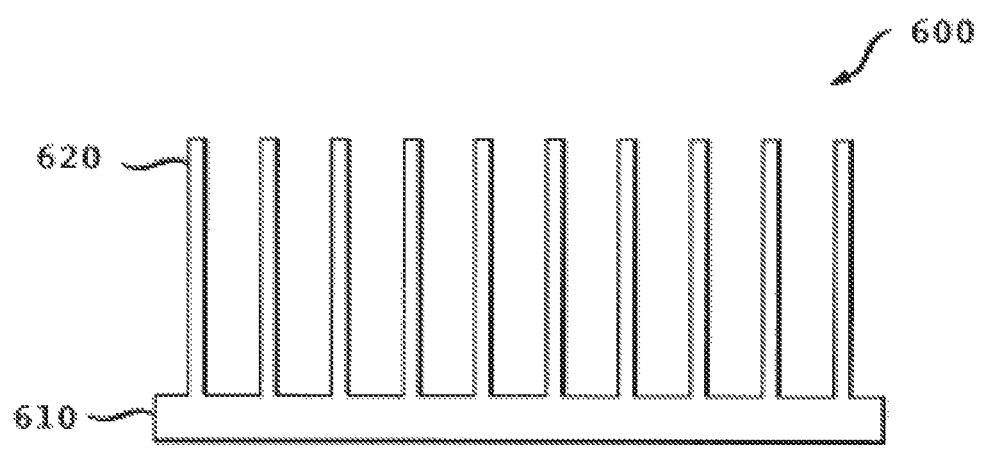

Turning now to FIGS. 6-10, shown are cross-sectional views illustrating how one might manufacture a microstructured hybrid actuator assembly. FIG. 6 shows the apparatus 600 at an initial stage of manufacture. The apparatus 600 of FIG. 6 includes a substrate 610 having a plurality of microactuators 620 formed thereover. The substrate 610 may comprise similar materials as the substrate 510. Accordingly, the plurality of microactuators 620 are arrays of isolated high-aspect-ratio rigid structures. Nevertheless, other layouts might be used.

The plurality of microactuators 620 may be manufactured using many different processes. In one embodiment, however, the plurality of microactuators 620 may be formed from a surface of a silicon or silicon-on-insulator substrate by conventional photolithographic and deep reactive ion etching (DRIE) procedures. For example, a DRIE process such as the Bosch process, as presented in U.S. Pat. No. 5,501,893, which is incorporated herein by reference in its entirety, could be used to define the plurality of microactuators 620. Nevertheless, other processes might also be used to form the plurality of microactuators 620.

After defining the plurality of microactuators 620, for example using the Bosch process, the plurality of microactuators 620 may be cleaned. In one embodiment, the plurality of microactuators 620 are cleaned using an oxygen ($O_2$) plasma, and are then allowed to mature at conditions configured to allow the formation of silanol (Si—OH) groups.

Figure 7:
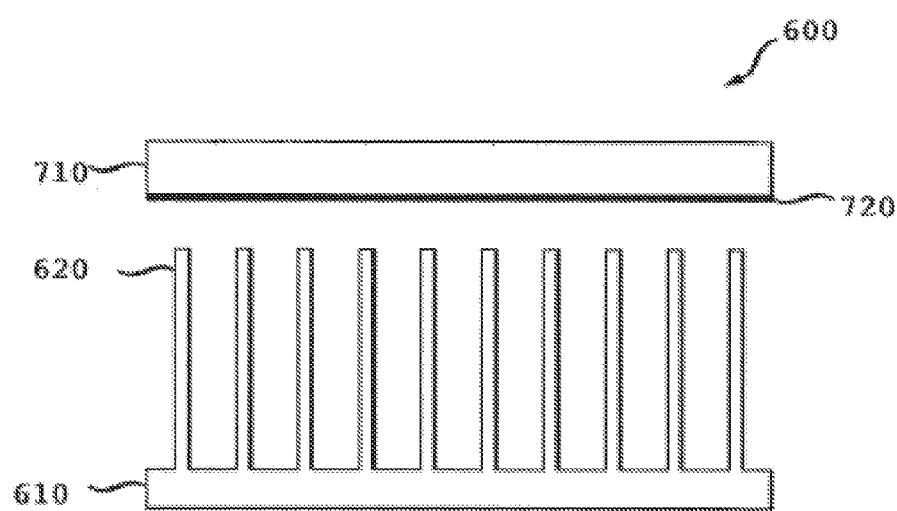

Turning now to FIG. 7, illustrated is the apparatus 600 of FIG. 6 after positioning a confining surface 710 over the plurality of microactuators 620. The confining surface 710, in one embodiment, comprises a silicon wafer. Nevertheless, some embodiments exist wherein the confining surface 710 comprises a different material.

Attached to a surface of the confining surface 710 is an anchoring layer 720. The material composition and thickness of the anchoring layer 720 may vary as appropriate. However, one exemplary embodiment exists wherein the anchoring layer 720 of poly (glycidylmethacrylate) (PGMA) is deposited from about 1% solution in methylethyl ketone (MEK) upon the confining surface 710. The resulting thickness of the anchoring layer 720, at least in this instance, ranges from about 1.0 nm to about 1.5 nm.

After forming the anchoring layer 720, it may be annealed at about 110° C. for about 15 minutes. Such an annealing step attempts to ensure the formation of covalent bonds between the epoxy groups of the PGMA and the silanol groups on the confining surface 710 surface. Thereafter, further modification with acrylic acid (AcA) allows the introduction of reactive acrylic groups due to the reaction of the remaining epoxy groups of the PGMA with carboxyl groups of AcA.

Figure 8:
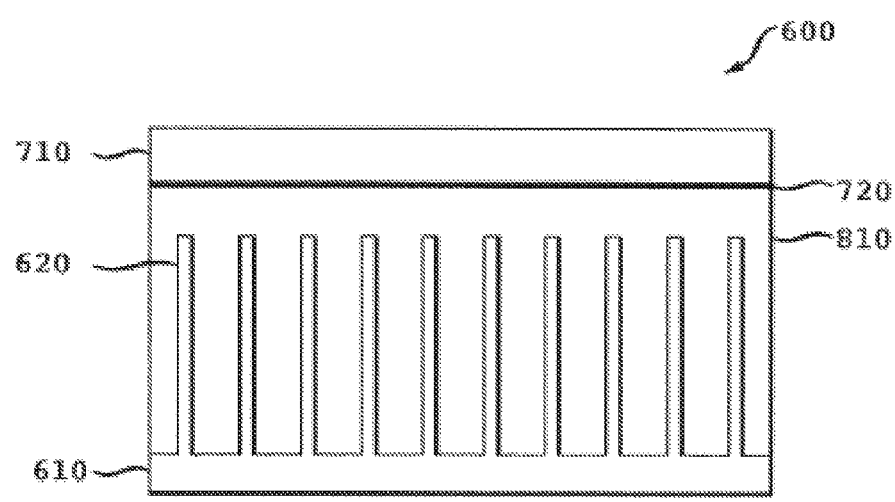

Turning now to FIG. 8, illustrated is the apparatus 600 of FIG. 7 after sandwiching a polymerizate solution 810 between the substrate 610 and the confining surface 710, and thus surrounding the plurality of microactuators 620 with the polymerizate solution 810. The polymerizate solution 810 may be placed between the substrate 610 and the confining surface 710 using many different processes; however, in one embodiment the polymerizate solution 810 is deposited there between by dip coating or drop casting. Other placement methods could nonetheless also be used.

Depending on the design of the device, the polymerizate solution 810 may vary. In the given embodiment of FIG. 8, however, the polymerizate solution 810 includes acrylamide (AA) in water solution, with a cross linking agent (e.g., N,N'-methylenebisacrylamide (bis-AA)) and an initiator (e.g., ammonium persulfate (APS)). In this embodiment the polymerizate solution 810 might include about 40 wt % of AA, about 2 wt % of bis-AA and about 2 wt % of APS in water. Such a polymerizate solution 810 might result in a polymer layer that changes its thickness based upon moisture changes. Those skilled in the art of polymer chemistry, would nonetheless understand the different polymerizate solutions 810 that might be used herein.

Figure 9:
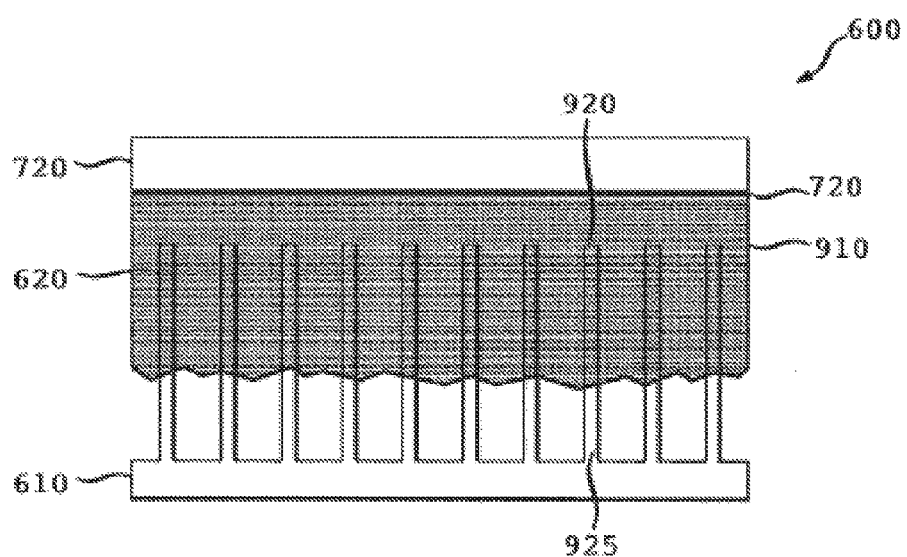

Turning now to FIG. 9, illustrated is the apparatus 600 of FIG. 8 after subjecting the polymerizate solution 810 to a thermo-initiated polymerization step, and thereby forming a polymer layer 910. The thermo-initiated polymerization step, in one embodiment, includes placing the apparatus 600 having the polymerizate solution 810 within a heat source and annealing the structure at about 50° C. for about 1 hour to initiate polymerization. Those skilled in the art understand, however, that the time and temperature for the polymerization reaction may vary with the desired thickness of the final polymer layer 910. Accordingly, the disclosed time and temperature are but one disclosed example.

The polymer layer 910 resulting from the aforementioned polymerizate solution 810 might be responsive to changes in moisture. For instance, a stimulus consisting of moisture could be used to change the thickness of the polymer layer 910, and thus move the plurality of microactuators 620, such as was discussed above with respect to FIGS. 5A and 5B. Alternatively, however, the polymer layer 910 might comprise hydrogels such as N-isopropylacrylamide and N,N'-methylenebisacrylamide that can swell by at least about five times as the temperature is lowered from above 37° C. to below 32° C. (e.g., a change in temperature of at least about 5° C.).

Alternatively, the polymer layer 910 can comprise hydrogels that swell and contract significantly in response to variations in the pH or metal ion concentration in a fluid located thereby.

The resulting polymer layer 910, as is illustrated, is attached to the confining surface 710 via the anchoring layer 720. Moreover, the plurality of microactuators 620 are located within the polymer layer 910. More specifically, the first end 920 of each of the plurality of microactuators 620 is in the polymer layer 910 wherein the second end 925 of each of the plurality of microactuators 620 protrudes through the polymer layer 910.

Figure 10:
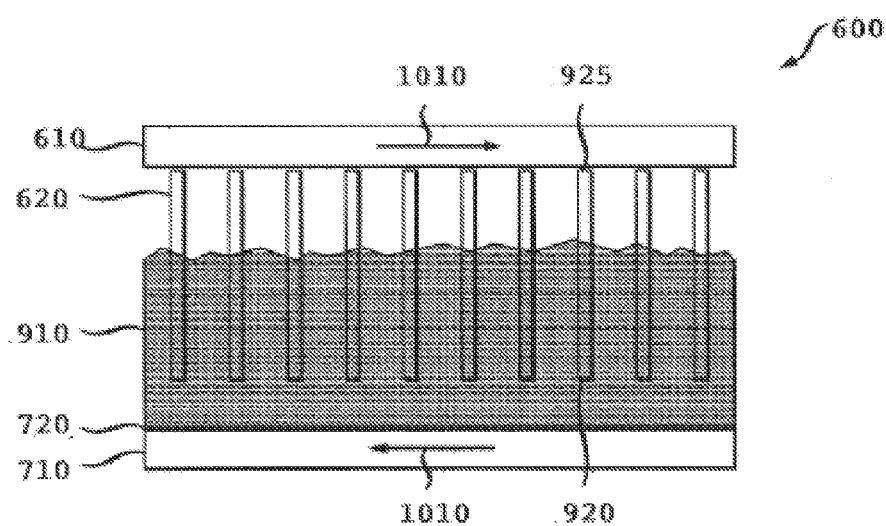

Turning now to FIG. 10, illustrated is the apparatus 600 of FIG. 9 after separating the substrate 610 from the confining surface 710. For example, by applying a shear stress 1010, the substrate 610 and the confining surface 710 may be separated. As a result of AA polymerization in-situ, the hydrogel film remains attached to the substrate 710 via the anchoring layer 720. Thus, the plurality of microactuators 620 embedded into the polymer layer 910 appear better attached thereto than to the substrate 610. Accordingly, the plurality of microactuators 620 get detached from the substrate 610 and fully transferred onto the confining surface 710.

After separating the substrate 610 and the confining surface 710, the apparatus 600 may be rinsed to remove unreacted monomers and cross-linked molecules therefrom. Thereafter, the apparatus 600 may be dried in a vacuum, thus resulting in the contracted polymer layer 910 with tilted microactuators.

Figure 5:
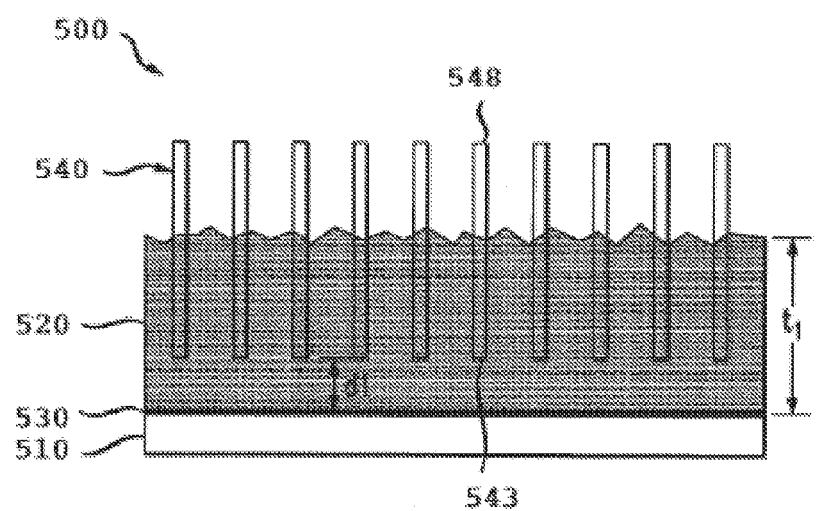
FIGS. 5-10 illustrate cross-sectional views as to how an apparatus described herein can be manufactured.
Figure 5:
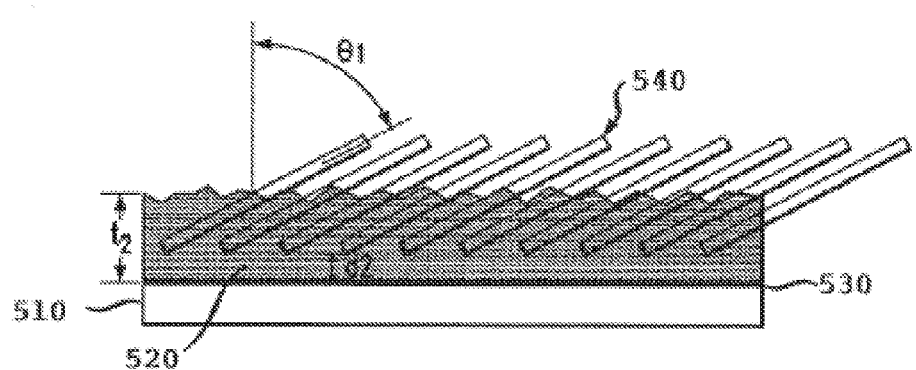

What often ultimately results from the process of FIGS. 6-10 is an apparatus substantially similar to the apparatus 500 of FIGS. 5A and 5B. Accordingly, the substrate 510 of FIGS. 5A and 5B is substantially similar to the confining surface 710 of FIGS. 7-10. Likewise, the plurality of microactuators 610 of FIG. 10, as well as the plurality of microactuators 540 of FIG. 5, are separated from the confining surface 710 and substrate 710, respectively.

Additional details for forming an array or microactuators may be found in Pub. No. US 2007-0237937, entitled "Environmentally Sensitive Nanostructured Surfaces", and US 2008/007357, incorporated herein by reference in its entirety, which are incorporated by reference herein in its entirety.

Methods for forming microstructured surfaces have been described in WO 2009/158631, which is incorporated by reference herein in its entirety. Specifically, WO 2009/158631 describes processes for making microactuators using molds.

Figure 11:
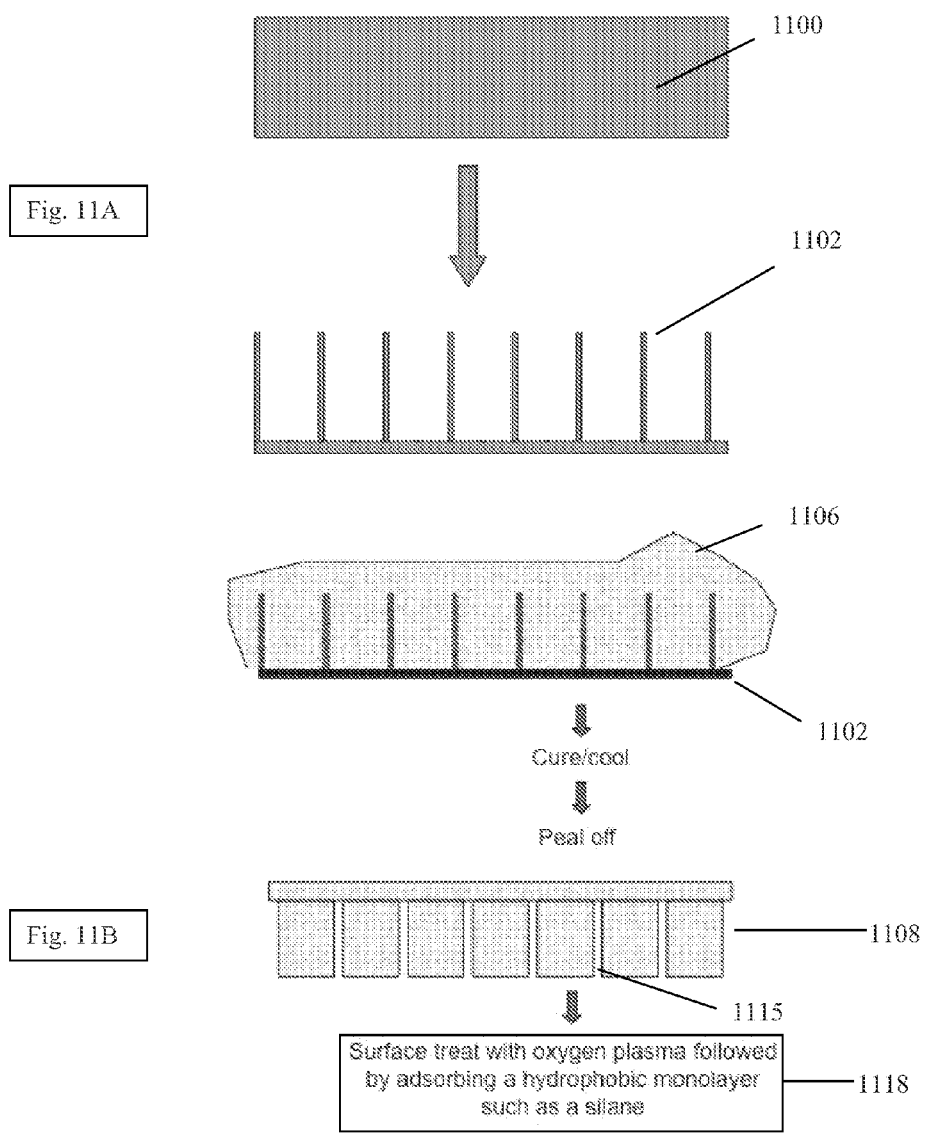
FIGS. 11A-11C provide a schematic illustration of a process for producing replicas of high-aspect-ratio microactuators using molds according to one embodiment of the invention.
FIG. 11D provides a schematic illustration of a process for producing replicas of high-aspect-ratio microactuators according to one embodiment of the invention where the high-aspect-ratio microactuators and the backing are made of different materials.
Figure 11:
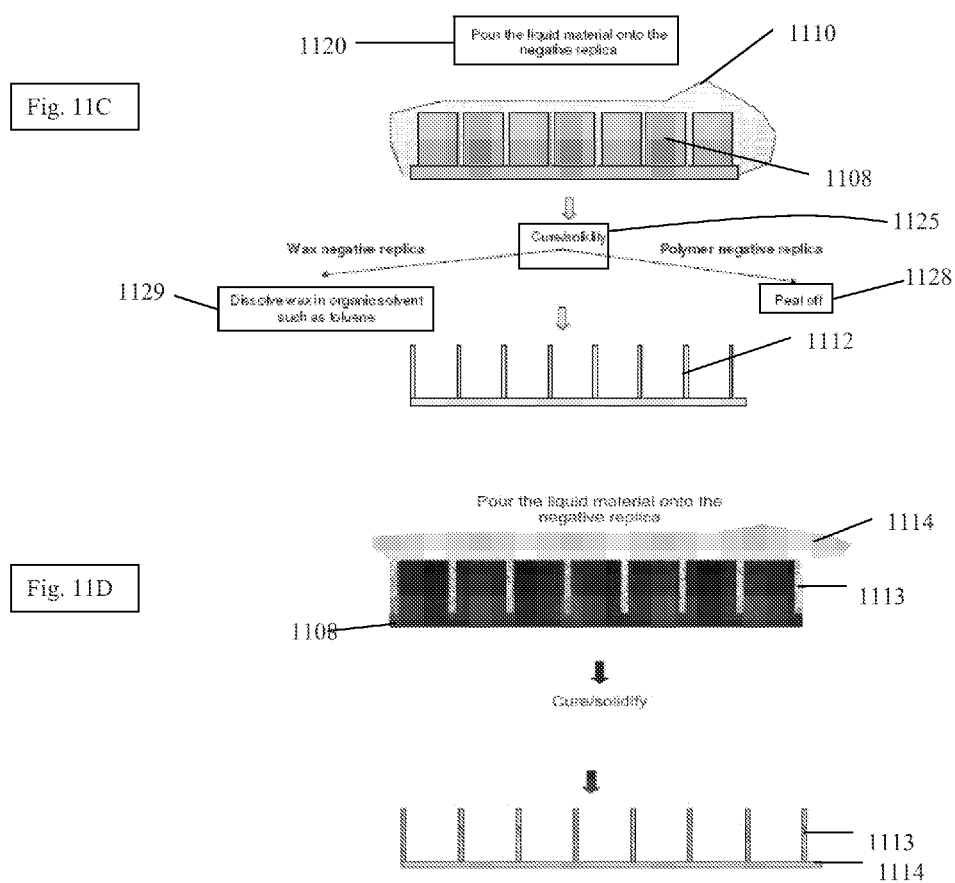

FIG. 11 illustrates the steps involved in the production of a high-aspect-ratio microactuator replica. In the first step, FIG. 11A, the desired high-aspect-ratio microactuator 1102 is formed using any desired technique, such as photolithography using a traditional material 1100 such as silicon or GaAs, or by growth or self-assembly of nano-wires, nanotubes or other natural biological or geological microactuator. The original replica can be formed using traditional fabrication techniques such as photolithography, e-beam and the like. Although such techniques can be time consuming and costly, they are acceptable methods for forming the original, as only a single replica needs to be prepared.

The features of the microstructured replica can have a range of dimensions. For example, the features can have a moderate aspect, e.g., ca. 3 or more up to high features of 50 or 100 aspect ratio. The features can have dimensions of nanometers in thickness, e.g., greater than 10 nm, or microns in thickness, e.g., greater than 1 μm and up to about 1 cm in thickness and can be quite long, e.g., greater than 100 nm or greater than 10 μm and up to several cm in length. The spacings between the features could be at the length scale of the width of the features, e.g., greater than 100 nm, or significantly more separated, e.g., at the distances commensurate with the height of the features, so that the features at their maximum tilt cover the entire surface of the substrate. Typically, the features are of regular profile, without complex overhangings, so that they can readily replicated by mold casting.

In one non-limiting example, a 2D array of microactuators is made from silicon by standard Deep Reactive Ion Etching (DRIE) using the Bosch process and has a pitch range (e.g., a distance between centers of adjacent features) from about 0.5 microns to 14 microns, height range of about 2-10 microns, and post diameter range of about 100 nm to 1 micron. In some embodiments, other geometries and feature sizes can be used.

In the second step, shown in FIG. 11B, a negative replica mold 1108 of the original structure is formed using a suitable replica material. Exemplary materials include but not limit to those that can be melted to liquid and cooled to harden to the final form. Wax, e.g., paraffin wax, is an example of such a replica material. In some embodiments, the replica material can be a polymer or prepolymer 1106 that cures, using for example heat or UV or any curing agent, to provide a permanent negative replica of the microactuator 1108. The curable polymer can be a flexible elastomeric polymer that can be deformed, but which retains and returns to its original cast form. Exemplary flexible and/or curable polymers include silicone rubbers and siloxanes of various compositions, such as polydimethylsiloxane (PDMS); polyurethanes, or other moldable polymers and resins, such as poly(ethylene glycol) diacrylate (PEGDA), alginates, or perfluoropolyether. In some embodiments, the replica material can be a hydrogel or a hydrogel prepolymer to fabricate microactuators illustrated in FIG. 14. For example, a mixture of hydroxyethylmethacrylate (HEMA), a crosslinker (ethyleneglycol dimethacrylate), a co-monomer to impart pH- or temperature responsivity, and a UV radical initiator can be prepared and cured inside a negative replica mold 1108 to fabricate such microactuators.

In some embodiments, the mold is made of PDMS, and prepolymer 1106 is poured over the microactuator 1102 to be replicated and kept under vacuum, e.g., for about one hour, to remove bubbles that may form between the polymer and the microactuator. Curing of the polymer is then initiated. In some embodiments, the mold is made of paraffin wax, and the wax replica material is melted, and poured over the original structure. The wax is kept hot for several minutes to ensure that the wax penetrates fully around the microactuator, and is then cooled and removed from the original structure to produce the negative replica 1108 with recesses such as 1115. Desirably, the negative replica is able to peel off easily without disrupting the silicon fine structure, so that its features can be accurately replicated over a large scale and a scale as small as few nanometers. To this end, the original replica can be treated to reduce surface sticking as indicated by process 1118. Any suitable surface treatment may be used. A non-limiting example is (heptadecafluro-1,1,2,2-tetra-hydrodecyl)trichlorosilane. In some non-limiting embodiments, the negative replica is a silicone polymer such as PDMS and the PDMS is surface treated with ozone and then treated chemically with an anti-stick thin coating, as illustrated in process 1118.

Next, the replica is made using the negative replica 1108 as a mold (FIG. 11C). In this process, a replica material 1110 is applied to the negative replica 1108 so as to completely fill the negative replica leaving no gaps or holes. As illustrated in process 1120, a material is introduced into the negative replica. The replica material can vary widely depending on the desired properties of the replica and the replica microactuator can be fabricated from almost any material that can be cast or deposited or grown. For example, the replica can be prepared from flexible or thermoplastic polymers, such as PDMS, thermoset polymer, metals or even ceramics. For polymers and metals, a molten precursor such as a polymer precursor or liquid metal can be used to cast the replica. In the case of ceramics, the replica material can be deposited into the negative mold, for example using chemical or physical vapor deposition methods. If a liquid material is cast, the liquid is then cured or solidified, as illustrated by process 1125. For replicas made out of polymer, a liquid precursor of the polymer (prepolymer) is poured into the mold, filling the wells corresponding to the high-aspect-ratio structures. The polymer is then formed when the prepolymer is cured either with UV light or by heat. The material completely fills the negative replica and solidifies inside it. In order to prevent the formation of bubbles trapped between the mold material and the original structure, a vacuum is applied over the liquid. Once the material has solidified, the negative replica is simply peeled off in the case of a flexible polymer negative mold as illustrated by process 1128 or dissolved away in the case of a wax mold as illustrated by process 1129, leaving behind the free-standing microstructured material 1112. The microactuator 1112 can then either be used for a variety of applications, as described below, or can be used as a master for further replications. In the latter case, the microactuator is coated with an anti-sticking thin layer, such as fluorinated silane for future castings.

In one or more embodiments, replicas can be made from a large variety of replica material including polymers such as epoxy, polypropylene (PP), polyethylene (PE), polyvinylalcohol (PVA), poly methyl methacrylic acid (PMMA), polyurethane, silicone, and various hydrogels and biological macromolecules, e.g., alginates, collagen, agar; metals and alloys which have a low melting point, such as InBi, Wood's alloy, and Field's metal; and ceramics including $Al_2O_3$, $HFO_2$, $SiO_2$, $ZrO_2$, and $BaTiO_3$. Other polymeric materials, metals, alloys and ceramics can be used in the similar manner. Polymers have the advantage of having liquid monomer precursors that can be poured into the mold, and then polymerized in situ. The replicas can also be made out of metal alloys that have low melting points, i.e., below about 150 degrees C. These alloys can be cast in the liquid phase on the negative replicas and allowed to solidify.

Actuation

The mechanism of movement of the posts guides the design of functional microactuators for applications in activation and sensing. In one or more embodiments, actuators are formed by depositing an actuating material onto the structure that causes the desired motion.

By combining actuation of the posts and deformation of the 2D lattice the direction of actuation of the posts can be controlled. For example, anisotropically deforming the posts by anisotropic stretching changes the post cross section from circular to elliptical; this means that the posts will actuate more easily in the direction in which the dimension is smaller. The post can be specifically made as rectangular plates in cross-section to induce one-directional bending.

In one or more embodiments, an actuator includes one or more replicated microactuators and a polymer substantially surrounding a portion of the microactuators. The polymer layer is placed within and around replicated microactuators, and can exert a mechanical force on the walls of the posts at a base area where the posts meet the substrate, to cause bending or collapse. The polymer may surround the posts at a base of the posts. By way of example, the replicated microactuator can be a rigid rod, such as a ceramic post.

The microactuator/polymer actuator can be made in a variety of ways. In one approach, the polymer layer is infiltrated into the substrate surface by spin coating. In an alternative method, a film of polymer is spread on a second, flat substrate, and the tips of the posts are embedded into the polymer by placing the polymer-coated substrate onto the tips of the array of posts. After embedding the tips of the posts, the posts are broken from the original substrate near their bases by shear, to produce a tensegrity-type structure of free-standing posts embedded in a polymer layer. The polymer can be grown directly in the confinement of two surfaces as shown in FIG. 6-9. The polymer surrounding the base of the posts acts as a kind of muscle for the posts and can be actuated by a variety of different stimuli, including temperature, light, pressure, pH, humidity, an ion concentration, magnetic, acoustic, or electric fields.

The surface of microactuator can be coated by a variety of materials including dyes, metals, metal oxides, mixed metal oxides, other inorganic materials of low solubility, pigments. When the hydrogel layer is completely dry, all the microactuators will be at bent or tilted state exposing only one side of the microactuator. To this surface, various material deposition techniques, such as vapor deposition, spray coating, dip coating, screen printing, ink jet printing, can be employed to coat desired materials. These techniques are well known in the art.

An example of actuation of actuators made of two layers involving a hydrogel layer is illustrated in FIG. 14. As illustrated in FIG. 14, layer 1 is a transparent hydrogel layer that undergoes volume change in response to environmental stimuli. Layer 2 can comprise active optical materials such as fluorescent dye, pigment, rare earth-containing compound, bioluminescent materials, diffraction grating, photonic crystal, plasmonic material, multilayer reflector or an absorbing material, will be exposed upon actuation.

Temperature controlled actuation can be used to cause structural deformation of the replicated structures or of the infiltrated polymer layer.

This invention is further illustrated by the following examples, which should not be construed as limiting. Those skilled in the art will recognize, or be able to ascertain, using no more than routine experimentation, numerous equivalents to the specific substances and procedures described herein. Such equivalents are intended to be encompassed in the scope of the claims that follow the examples below.

EXAMPLES

Example 1

Figure 2:
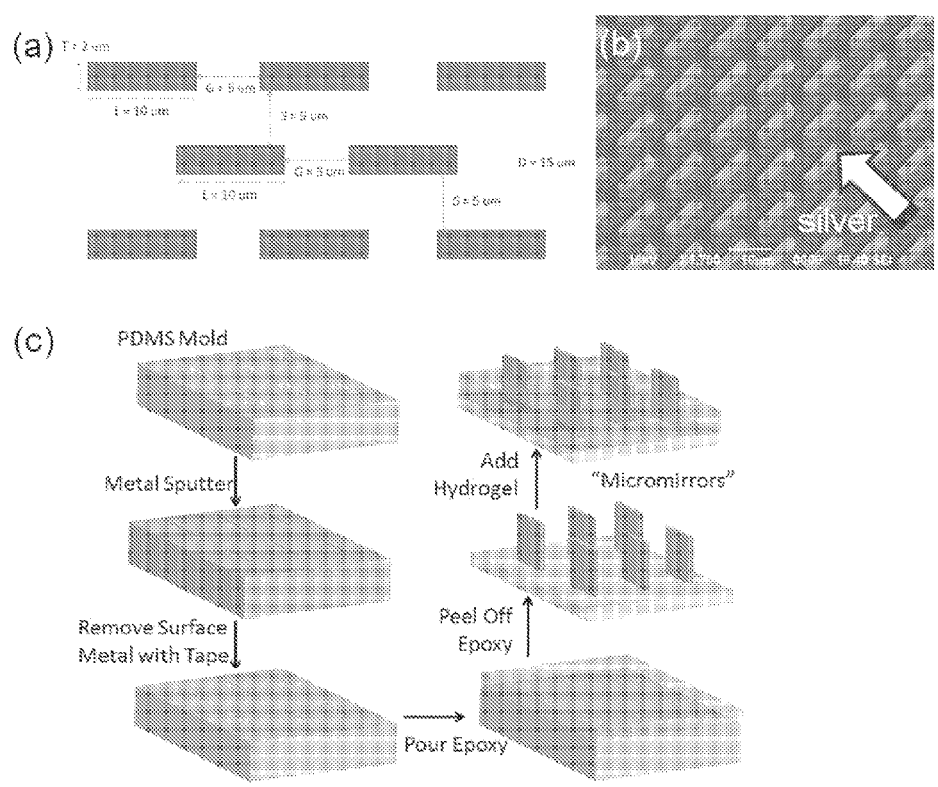
FIG. 2A is a graphic representation of the top view of a microplatelet layout in an exemplary optically active microplate array according to one embodiment of the invention.
FIG. 2B is a scanning electron microscope (SEM) image of a micromirror array according to one embodiment of the invention.
FIG. 2C is a schematic of the fabrication procedure for an optically active microactuator array, illustrated in connection with a micromirror array according to one embodiment of the invention.

This example provides a proof-of-concept design of adaptive light control through a hybrid microactuator assembly. An array of polymer microplates (10 µm wide, 21 µm high, and 2 µm thick, spaced 5 µm apart from neighboring microplates as shown in FIG. 2) was fabricated by replica molding from a silicon master structure. The microplate array was converted to an array of micromirrors by line-of-sight evaporation of 200 nm thick silver with a 10 nm titanium adhesion layer at various tilting angles. A hybrid actuator array was formed by UV-initiated radical polymerization of a temperature-responsive hydrogel layer, cross-linked poly(N-isopropylacrylamide), onto this micromirror array.

Figure 4:
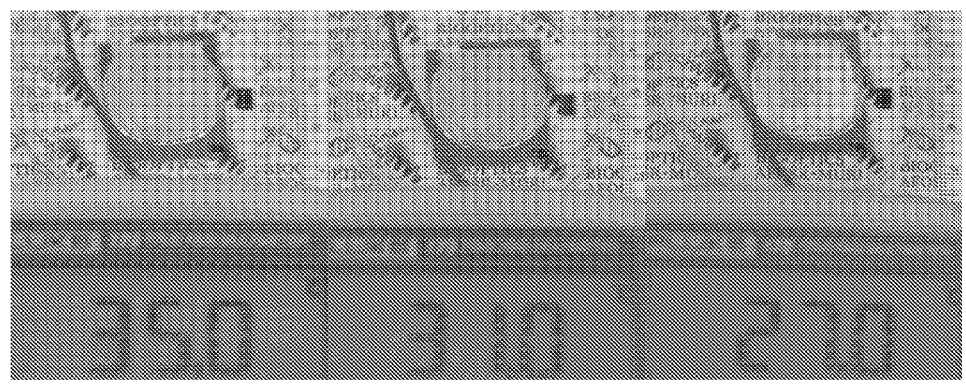
FIG. 4A shows an image of an exemplary hybrid actuator assembly according to one embodiment of the invention undergoing reflective to transparent (from left to right) optical switching in response to the temperature change.
FIG. 4B shows transmission characteristics of an exemplary hybrid actuator assembly according to one embodiment of the invention as a function of temperature.
Figure 4:
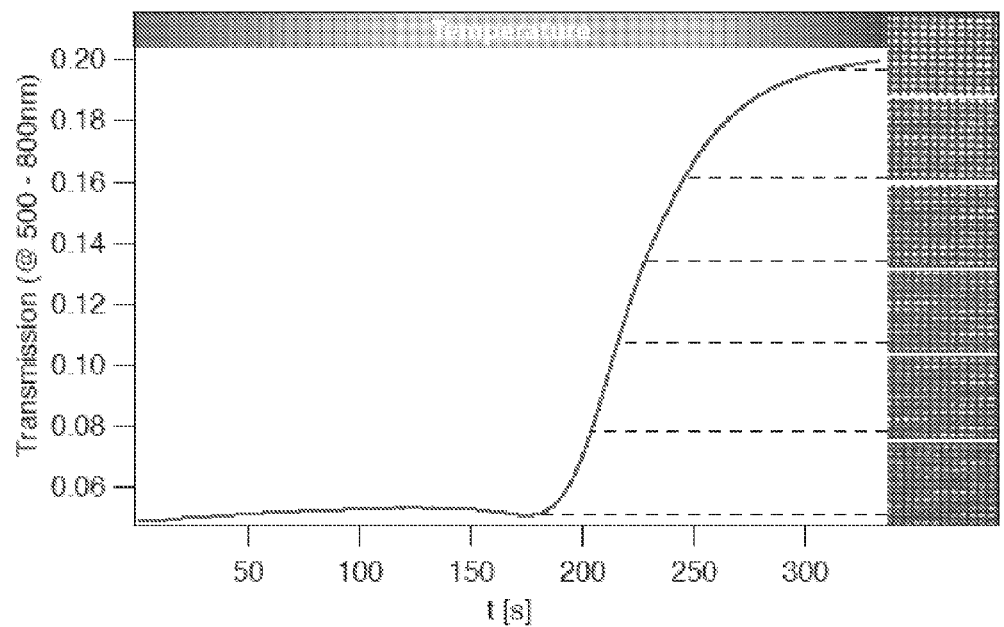

FIG. 4A shows an example of a hybrid microactuator assembly undergoing opaque to transparent optical switching in response to the temperature change between 27-35° C. (the temperature in ° C. is indicated at the bottom of the photograph). The temperature was measured using a thermocouple probe (brown lead) immersed in the water bath containing the sample. The LCST of the temperature-responsive gel used in this experiment is 32° C. The scale of the ruler is centimeter.

As can be seen in FIG. 4A, the hybrid microactuator assembly undergoes opaque to transparent transition when the temperature is lowered from 35° C. to 27° C.

FIG. 4B shows the change in the transmission of such array. A microactuator assembly was mounted on a microscope and the transmitted light was coupled to a fiber-optic spectrometer which recorded a set of optical spectra in the visible wavelength range (400 nm-700 nm). The transmittance was referenced to zero when the microactuator is in its bent state. As the microactuator assembly is slowly cooled to room temperature, the transmittance gradually increased from 0% to 20%. A series of corresponding transmission optical microscope images are placed next to the transmittance spectrum. This process is completely reversible and the contrast ratio (transmittance ratio of completely bent and completely straight state) can be tuned by changing the angle of metal deposition, the height and the distance of microactuator, and by changing the layout of the microactuator array (e.g. eclipsed vs. staggered).

Figure 16:
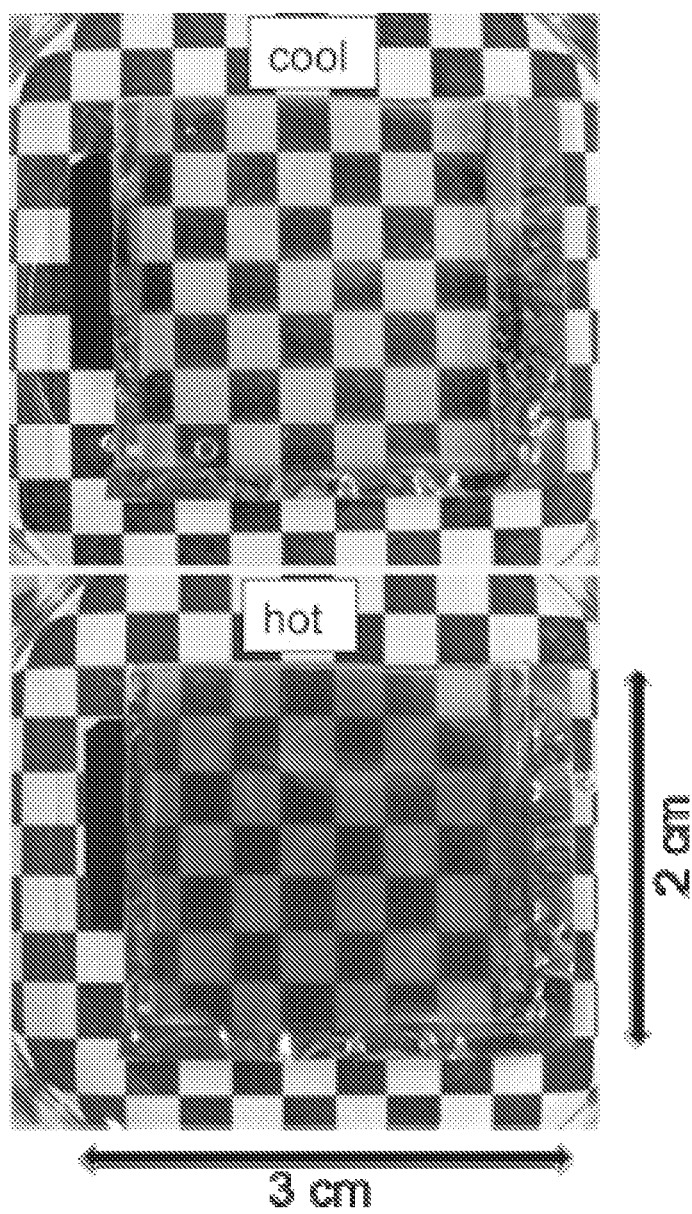
FIG. 16 is a photograph showing tunability of tinting created by a micromirror array embedded in a layer of thermoresponsive hydrogel according to one embodiment of the invention.

FIG. 16 shows another example where the contrast between the transparent state and the opaque state is tuned to allow more light pass through at 'off' state. FIG. 16 is an exemplary photograph showing tunability of tinting created by a micromirror array embedded in a layer of thermoresponsive hydrogel according to some embodiments of the invention. The hybrid actuator system undergoes reversible transition between a transparent state (cool, temperature is below 29° C.) and a less transparent state (hot, temperature is above 29° C.).

Figure 17:
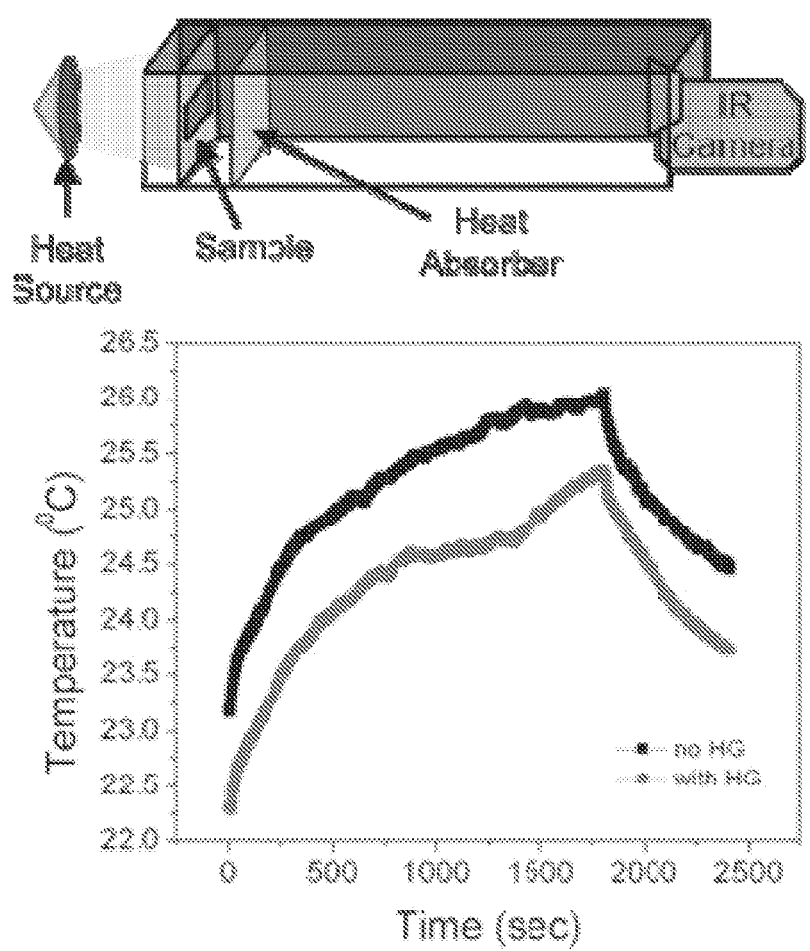
FIG. 17 is a schematic diagram of a model house used for testing temperature regulating feature of adaptive hybrid micromirror actuator assembly when used as a window (top panel) and temperature plots for a window without and with the hydrogel layer (bottom panel).

FIG. 17 illustrates a test setup for regulating temperature inside a small model house built with an insulating material (dry wall) with a three pane window mounted on one wall. The middle layer of the three pane window was switched between a control sample with an array of microplates with metal reflector coating but with no hydrogel layer and with a sample with hydrogel layer. An infrared heat lamp was turned on to illuminate the window at normal incidence. An aluminum screen with a Teflon coating on the backside was placed behind the window and the average temperature of the aluminum screen inside the room was monitored using an infrared camera by imaging the screen from behind (i.e., the Teflon-coated side). As can be seen in FIG. 17 (lower panel), the temperature of the screen increased monotonically when a window without hydrogel was placed while the temperature increase of the screen was resisted by the window with temperature-responsive hydrogel designed to actuate the micromirrors at 29° C. The temperature regulating window eventually failed to regulate the temperature under overwhelmingly hot temperature as indicated by the temperature increase after initial regulation. In both experiments, the temperature dropped monotonically when the heat lamp was turned off.

The top panel of FIG. 17 is a schematic diagram of a model house used for testing temperature regulating feature of adaptive hybrid micromirror actuator assembly when used as a window. The graph (bottom panel of FIG. 17) shows temperature plots for a window without hydrogel layer (upper curve) and with a hydrogel layer (lower curve). Only the lower curve shows temperature regulating behavior as indicated by a plateau (800 sec-1300 sec) before failing to regulate the temperature and continue to heat up (after 1300 sec). Both samples rapidly cooled down monotonically when the heat source was turned off at 1800 sec.

Exemplary photothermal local actuation of a gold-coated micromirror array in temperature-responsive hydrogel layer is shown in FIG. 15. Initially, all the mirrors are vertically standing up allowing the light pass through. The green dotted area was illuminated by a near-infrared diode laser at 910 nm. Each image was taken after every 15 s from the beginning of the illumination. The laser light is absorbed by the thin gold layer and is converted into heat (photothermal effect) actuating the mirrors to bend. The micromirror array becomes reflective as clearly shown in the figure and this area propagates as surrounding hydrogels are subsequently heated. When the laser is turned off, the micromirrors immediately come back to their normal upright configuration as this heating is extremely localized and surrounded by a large amount of cold water acting as a heat sink.

Example 2

Development of artificial temperature-sensitive hydrogel-muscle actuated "reflectophores": a protocol was developed to selectively coat an array of polymer "blades" with metal, to enhance reflectance only in the direction perpendicular to the blade orientation. When embedded in a thermally responsive hydrogel, these blades change their orientation in response to temperature changes. This changes the direction of strongest reflectance and thus the apparent color.

Figure 18:
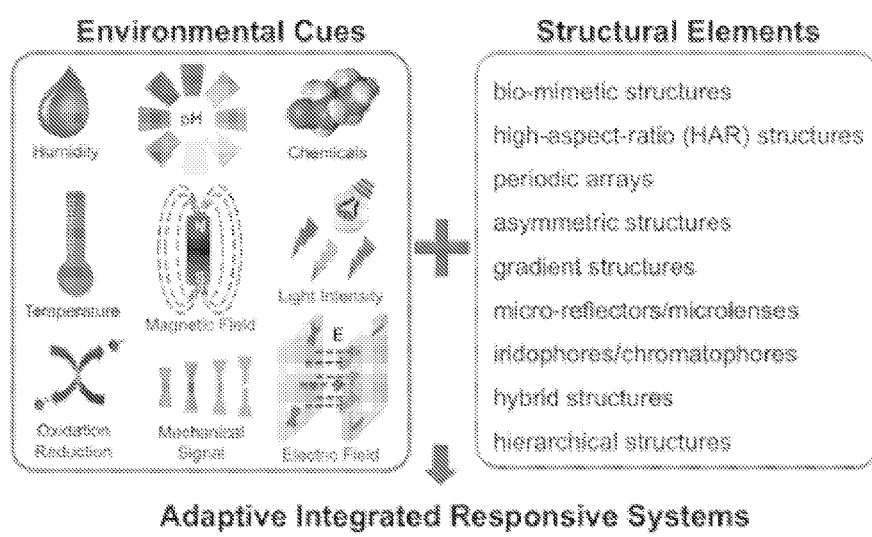
FIG. 18 illustrates exemplary combinations of environmental cues and structural elements that can be used to provide adaptive integrated responsive systems according to one embodiment of the invention.

Responsive materials used for artificial muscles and actuators can be integrated with conventional optical systems to construct hybrid structures that can respond to various environmental signals to adaptively change optical properties as summarized schematically in FIG. 18. Such hybrid adaptive optics were designed and fabricated by integrating two rarely combined systems: an array of polymeric micromirrors produced by replication and selective metallization, and a layer of thermo-responsive hydrogel with tunable swelling ratio and transition temperature. In order to fine-control the optical response for real applications, understanding the dynamics and geometry of each micromirror actuated by hydrogel can be valuable.

The transmittance and reflectance of the hydrogel-actuated micromirror array were measured at various optical wavelengths and at various incident and viewing angles as a function of temperature using a variable angle spectroscope with a temperature-controlled optical liquid cell. Exemplary data are shown in FIGS. 20-23. Diffraction of the incident light was predominantly due to the length scales of the micromirrors used. The experimental results matched well with FDTD (Finite Difference Time Domain) simulations. By "painting" each micromirror with additional iridophores or chromatophores, their type of stimulus and response can be dynamically tuned. For example, a gold-coated micromirror array embedded in thermo-responsive hydrogel was used and photothermally actuated only few micromirrors by irradiating with a near-infrared laser light as shown in FIG. 15. This figure shows a series of optical images of gold-coated micromirror array (each mirror is 20 µm long) photothermally actuated using an infrared laser diode (905-925 nm, 1000 mW, CW). The green dashed area indicates the irradiated area. Images were taken with ~15 second interval. The orange color is due to the reflection from the gold film coated only on the sidewalls of micromirrors. Since the photothermal heating takes place only in a localized volume, the rate of heating and cooling can be tuned much faster than heating or cooling the bulk liquid. The hybrid optical materials can also be useful as adaptive windows for self-regulation of lighting and thermal gain. Test samples of as large as 3 inch by 2 inch were fabricated as shown in FIG. 16.

Figure 19:
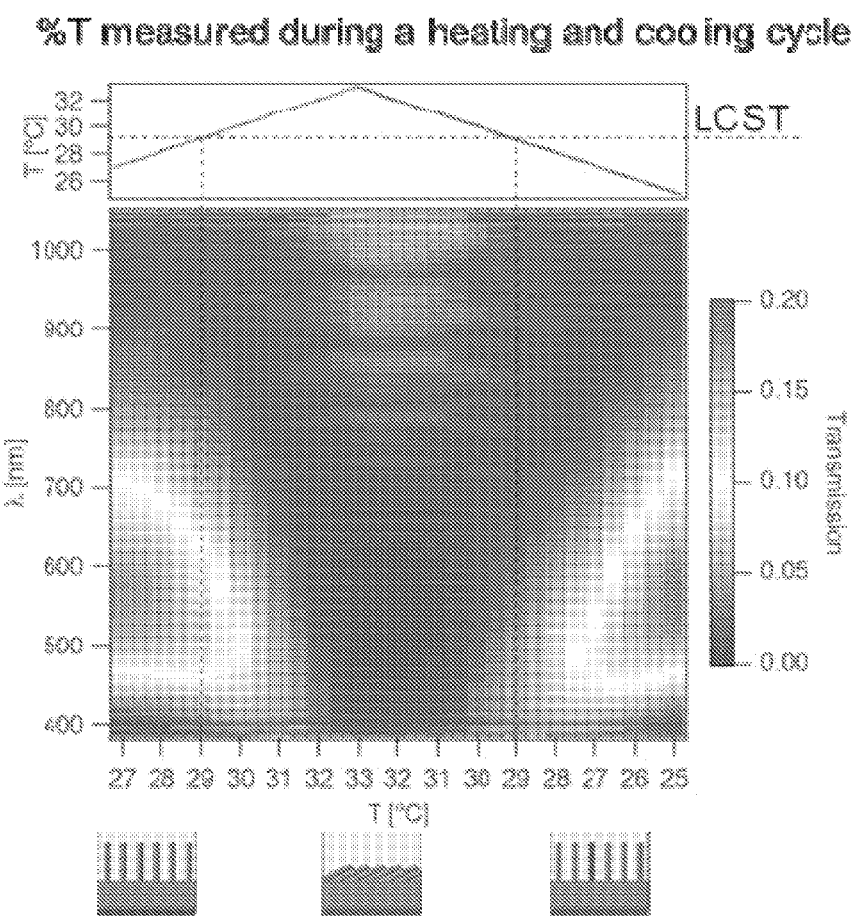
FIG. 19 illustrates the optical transmission data through an adaptive hybrid micromirror actuator assembly for visible wavelength as a function of the temperature of the surrounding environment according to one embodiment of the invention. LCST (Lower Critical Solution Temperature) indicates the temperature at across which the microactuators find a certain configuration.

FIG. 19 illustrates a contour plot of optical transmittance as functions of temperature and wavelength. The temperature was cycled from below LCST (29° C.) to above LCST, then back to below LCST. A schematic representation of upright (T<LCST (lower critical solution temperature), hydrogel is swelled) and bent (T>LCST, hydrogel is collapsed) micromirrors is also shown for the corresponding temperatures.

Figure 20:
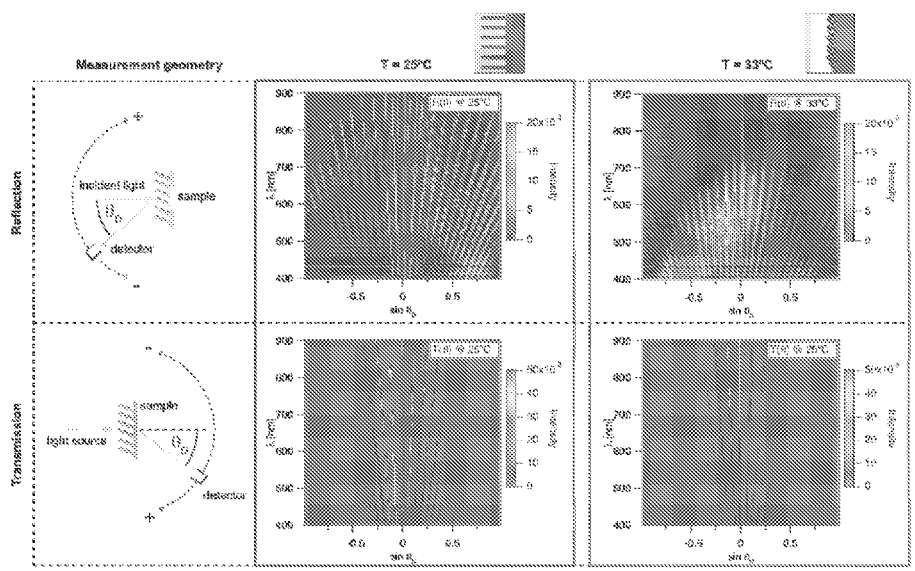
FIG. 20 illustrates the full angle scan of transmitted and reflected light for an adaptive hybrid micromirror actuator assembly for visible wavelength recorded at cold and hot temperatures according to one embodiment of the invention.

FIG. 20 a) illustrates a reflection and transmission contour plots of adaptive optical material recorded for different angles and wavelengths below (left) and above (right) LCST.

Figure 21:
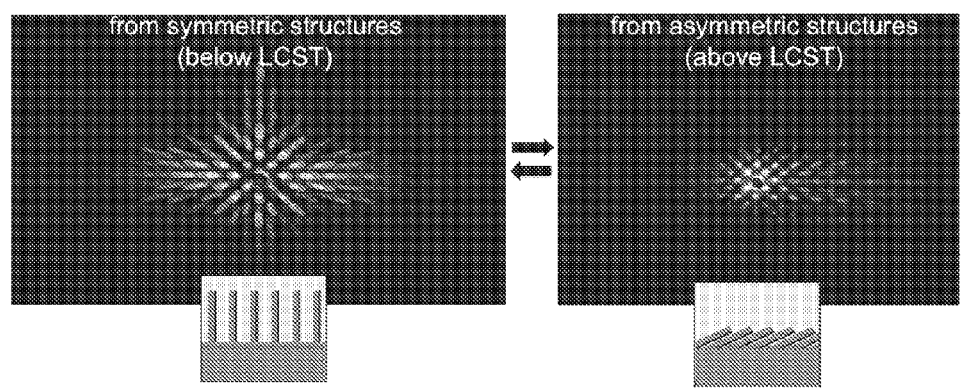
FIG. 21 illustrates a scatterometry data from an adaptive hybrid micromirror actuator array with staggered arrangement at cold and hot temperatures showing that the pattern of the scattered white light changes reversibly in response to the temperature change in the environment according to one embodiment of the invention.

FIG. 21 illustrates optical scatterometry showing signature diffraction patterns below LCST (symmetric, left) and above LCST (asymmetric, right).

Example 3

This example provides realization and characterization of large-area coverage dynamic periodic micro-arrays composed of individual diffraction elements imitating the "reverse color sequence" diffraction effect observed on the wings of the butterfly Pierella Luna.

A periodic array of plates on the micron-scale was fabricated, each containing a vertical nanometer-scale periodic roughness. This periodic roughness (scalloping) is controllable by tuning the etching conditions. Discretization of diffraction orders due to the periodicities on different lengths scales involved in the artificial systems was observed.

While diffraction has been identified as a cause of natural structural colors in some organisms, it is generally rare compared to photonic crystals or interference multilayer arrangements as the originators of bright, striking colors in nature. However, in 2010 an unconventional diffraction system was discovered on the wings of a butterfly with the purpose to create color variation in a broad angular range (Vigneron et al., *Phys. Rev. E* 82, 021903, 2010). Spots on the wing on the male butterfly, Pierella Luna, show a reverse color sequence due to the unique arrangement of the scale ridges and the deformation of the scales. This diffraction is caused by a vertically-oriented grating structure that inspires possibilities for creating and investigating novel photonic systems.

Polymer analogs of these structures have been created in the form of periodically arranged scalloped plates with the scallops functioning as the vertical diffraction gratings. The artificial systems are optically characterized using the recently developed variable-angle spectroscope and a novel diffraction microscope. Diffraction signatures caused by the different periodicities in the system, i.e., the plates and the scallops on the plates, have been clearly identified. By imaging the back-focal plane of the diffraction microscope objective that collects the light of the specimen, the diffraction can be visualized directly. Diffraction patterns consisting of square arrays of scalloped plates can be used in the design of novel optimized structures.

Interference phenomena were observed due to the periodicities on different lengths scales involved in the artificial systems. A more detailed investigation of these effects and synchronization of all the periodicities can allow a detailed tuning of the spatio-spectral reflectance and transmittance behavior of these bio-inspired diffraction systems. The elasticity of the polymer plates permits their deformation by bending. A reversible controlled bending of the plates (for example achieved by incorporation into pH- or temperature-responsive hydrogels) can allow a dynamic control of the color.

Figure 22:
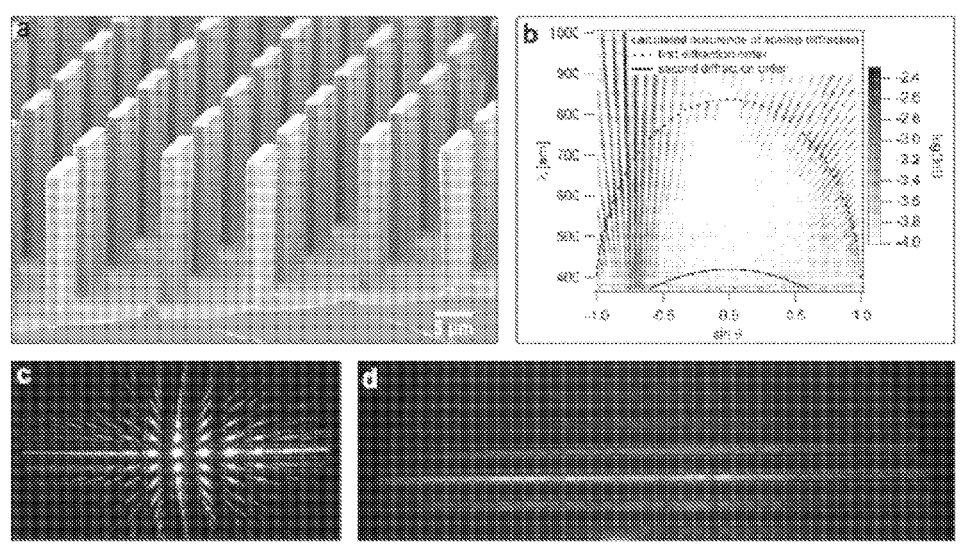
FIG. 22 illustrates (a) SEM micrographs of diffracting structures replicated in epoxy according to one embodiment of the invention. (b) Variable angle spectroscope measurements for 0° and 30° light incidence angles onto the diffracting structures shown in (a). Dashed lines indicate the location of diffraction orders caused by the scallops. (c) Diffraction microscopy image of sample (a) where objective is orthogonal to light source compared to calculated plate diffraction order locations. (d) Optical micrograph of the diffraction pattern observed from gold-coated plates with Littrow mounting and 45° light incidence annotated to show grating periodicities calculated from angular spacing between the −1 and +1 diffraction orders.
Figure 23:
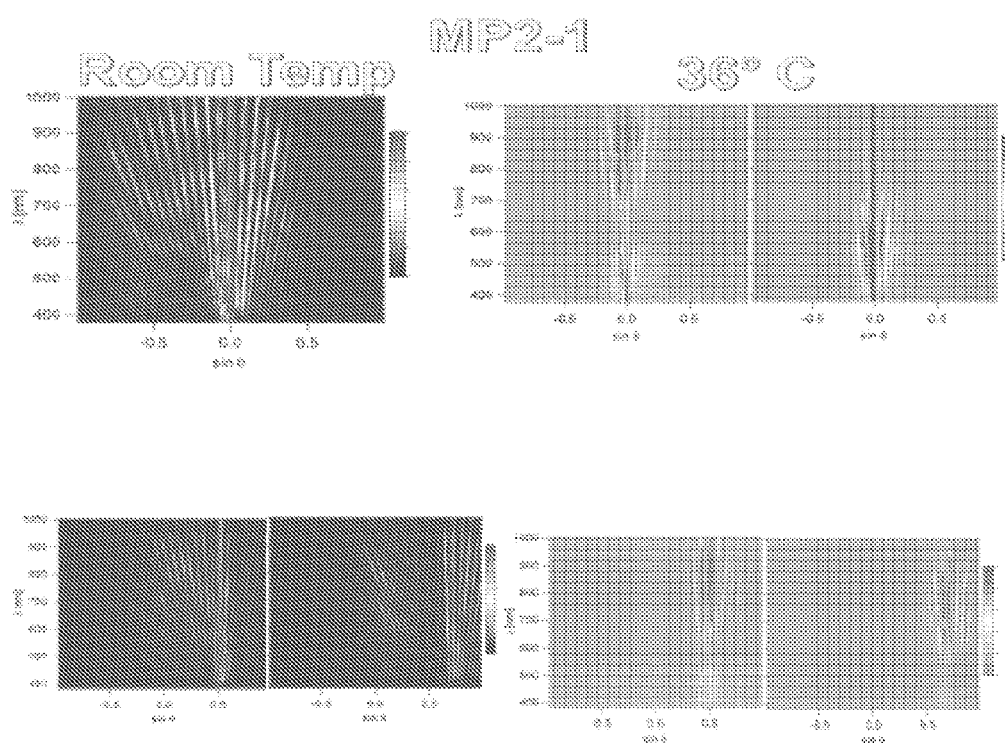
FIG. 23 illustrates variable angle spectroscope measurements for an adaptive micromirror actuator array with eclipse geometry taken at cold and hot temperatures and at 0° and 30° light incidence angles onto the samples according to one embodiment of the invention.

FIG. 22 a) shows an SEM image of an array of scalloped plates. FIG. 22 b) shows contour plot of the intensity of light reflected from the plates as a function of wavelength and direction. The dashed and solid lines mark the spectral areas where diffraction signatures due to the scallops are expected. FIG. 22 c) is the visualization of diffraction due to the periodic arrangement of plates and d) is the visualization of diffraction due to the scallops on each plate.

What is claimed is:

1. An apparatus comprising:
   a substrate with a surface;
   an environmentally responsive hydrogel polymer layer disposed on a region of the surface; and
   a plurality of microactuators embedded in the environmentally responsive hydrogel polymer layer, wherein the plurality of microactuators are a plurality of plates;
   wherein the microactuators are configured to move from a first position to a second position in response to a volume change of the environmentally responsive hydrogel polymer layer from a first volume to a second volume and wherein the movement of microactuators alters optical properties of the apparatus.

2. The apparatus of claim 1, wherein the microactuators are configured to reversibly move from a first position to a second position.

3. The apparatus of claim 1, wherein the microactuators are configured to tilt with respect to a normal of the surface in response to the change in volume.

4. The apparatus of claim 1, wherein the plurality of microactuators comprise a coating that affects their optical properties.

5. The apparatus of claim 1, wherein the plurality of plates comprise a photonic crystal, a plasmonic material, a multilayer reflector, a luminescent material, or a diffraction grating that affects their optical properties.

6. The apparatus of claim 1, wherein the plates comprise a rare earth element or compound, plasmonic material, a fluorescent dye, a pigment or a bioluminescent material that affects their optical properties.

7. A method for manufacturing an apparatus, the method comprising:

(a) providing a substrate with a surface;
   (b) embedding a plurality of microactuators in an environmentally responsive hydrogel polymer layer disposed on a region of the surface, wherein the plurality of microactuators are a plurality of plates,
   wherein the microactuators are configured to move from a first position to a second position in response to a change in volume of the environmentally responsive hydrogel polymer layer from a first volume to a second volume and wherein the movement of microactuators alters optical properties of the apparatus.

8. The method of claim 7, wherein the apparatus is the apparatus of claim 1.

9. An apparatus comprising:
   a substrate with a surface; and
   a plurality of microactuators comprising an environmentally responsive hydrogel polymer layer disposed on a region of the surface, wherein the plurality of microactuators are a plurality of plates;
   wherein the microactuators are configured to move from a first position to a second position in response to a volume change of the environmentally responsive hydrogel polymer layer from a first volume to a second volume and wherein the movement of microactuators alters optical properties of the apparatus.

10. The apparatus of claim 9, wherein the microactuators are configured to reversibly move from a first position to a second position.

11. The apparatus claim 9, wherein the microactuators are configured to tilt with respect to a normal of the surface in response to the change in volume.

* * * * *